US008951860B2

(12) United States Patent
Ishii et al.

(10) Patent No.: US 8,951,860 B2
(45) Date of Patent: Feb. 10, 2015

(54) MANUFACTURING METHOD OF SEMICONDUCTOR DEVICE

(75) Inventors: Yasushi Ishii, Kanagawa (JP); Hiraku Chakihara, Kanagawa (JP); Takahiro Maruyama, Kanagawa (JP); Akihiro Nakae, Kanagawa (JP)

(73) Assignee: Renesas Electronics Corporation, Kawaski-shi (JP)

( * ) Notice: Subject to any disclaimer, the term of this patent is extended or adjusted under 35 U.S.C. 154(b) by 216 days.

(21) Appl. No.: 13/612,630

(22) Filed: Sep. 12, 2012

(65) Prior Publication Data

US 2013/0084684 A1    Apr. 4, 2013

(30) Foreign Application Priority Data

Oct. 3, 2011    (JP) .................................. 2011-219364

(51) Int. Cl.
| | |
|---|---|
| H01L 21/336 | (2006.01) |
| H01L 21/28 | (2006.01) |
| H01L 29/423 | (2006.01) |
| H01L 29/66 | (2006.01) |
| H01L 29/792 | (2006.01) |
| H01L 27/115 | (2006.01) |
| H01L 49/02 | (2006.01) |

(52) U.S. Cl.
CPC .... *H01L 21/28282* (2013.01); *H01L 29/42344* (2013.01); *H01L 29/66833* (2013.01); *H01L 29/792* (2013.01); *H01L 27/11573* (2013.01); *H01L 28/60* (2013.01); *H01L 2223/54426* (2013.01); *H01L 2223/5446* (2013.01)
USPC ........................................................ 438/257

(58) Field of Classification Search
USPC ......................................................... 438/257
See application file for complete search history.

(56) References Cited

U.S. PATENT DOCUMENTS

| 2009/0050956 A1* | 2/2009 | Ishimaru et al. .............. 257/324 |
| 2010/0038700 A1* | 2/2010 | Okazaki et al. ............... 257/324 |
| 2010/0078705 A1* | 4/2010 | Chakihara et al. ............ 257/324 |
| 2011/0129984 A1* | 6/2011 | Funayama et al. ............ 438/424 |

FOREIGN PATENT DOCUMENTS

JP    6-151783    5/1994

* cited by examiner

*Primary Examiner* — Charles Garber
*Assistant Examiner* — Stanetta Isaac
(74) *Attorney, Agent, or Firm* — Miles & Stockbridge P.C.

(57) ABSTRACT

The present invention improves the production yield of a semiconductor device having nonvolatile memory cells of a split gate structure. The level difference of a lower layer resist film with which an end of a memory mat is covered is gentled, the uniformity of the thickness of a resist intermediate layer formed over the lower layer resist film is improved, and local thickness reduction or disappearance is prevented by, after forming a silicon oxide film and a silicon nitride film over each of selective gate electrodes formed in a memory cell region of a semiconductor substrate, removing the silicon oxide film and the silicon nitride film over the selective gate electrode located on the outermost side (a dummy cell region) of the memory mat in the gate length direction.

16 Claims, 34 Drawing Sheets

MANUFACTURING METHOD OF SEMICONDUCTOR DEVICE

CROSS-REFERENCE TO RELATED APPLICATIONS

The disclosure of Japanese Patent Application No. 2011-219364 filed on Oct. 3, 2011 including the specification, drawings and abstract is incorporated herein by reference in its entirety.

BACKGROUND

The present invention relates to a manufacturing technology of a semiconductor device, in particular to a technology effective in applying it to the manufacture of a semiconductor device having nonvolatile memory cells of a split gate structure.

For example, Japanese Unexamined Patent Publication No. Hei 06 (1994)-151783 (Patent Literature 1): discloses a semiconductor device having a linear dummy pattern formed at a boundary between a memory cell array region and a peripheral circuit region; and describes a structure wherein the gate of a memory cell has a double layer structure comprising polycrystalline Si, the dummy pattern has a single layer structure comprising polycrystalline Si, and the height of the dummy pattern from the principal face of a semiconductor substrate is lower than the height of the gate of the memory cell.

PREVIOUS TECHNICAL LITERATURE

Patent Literature

[Patent Literature 1]
Japanese Unexamined Patent Publication No. Hei 06 (1994)-151783

SUMMARY

As an electrically rewritable nonvolatile memory, an EEPROM (Electrically Erasable Programmable Read Only Memory) using polycrystalline silicon as a floating electrode is mostly used. In an EEPROM of this structure however, if a defect exists somewhere at a part of an oxide film surrounding a floating gate electrode, since a charge accumulation layer is an electrical conductor, the whole charge stored in an accumulation node is discharged by abnormal leakage in some cases. It is concerned that the problem may occur conspicuously particularly when miniaturization advances and an integration degree increases hereafter.

In this context, in recent years, attention is focused on a MONOS (Metal Oxide Nitride Oxide Silicon) type nonvolatile memory cell having an insulation film, such as a nitride film, having a trap level as a charge accumulation layer. On this occasion, since electric charge contributing to data storage is accumulated in a discrete trap of a nitride film that is an insulator, even when a defect occurs and abnormal leakage occurs somewhere at a part of an oxide film surrounding an accumulation node, the whole charge in a charge accumulation layer is not discharged and hence it is possible to improve the reliability of data retention.

As a MONOS type nonvolatile memory cell, a memory cell of a single transistor structure is proposed. A memory cell of such a structure is likely to be influenced by disturbance in comparison with a memory cell of an EEPROM and hence a memory cell of a split gate structure comprising two transistors having a selective gate electrode is proposed.

As a MONOS type nonvolatile memory cell of a split gate structure, there is a memory cell having a sidewall-shaped memory gate electrode formed by self-alignment over a side face of a selective gate electrode through an insulation film. On this occasion, because a register margin in photolithography is unnecessary and the gate length of a memory gate electrode formed in a self-aligned manner can be not larger than a minimum resolution dimension of photolithography, a more miniaturized memory cell can be obtained in comparison with a memory cell having a memory gate electrode formed with a photoresist pattern.

According to the study by the present inventors however, the following knowledge has been found in a manufacturing method of a semiconductor device having MONOS type nonvolatile memory cells.

A field-effect transistor configuring a peripheral circuit is formed over a substrate where a MONOS type nonvolatile memory cell is formed. Usually, a gate electrode of a field-effect transistor configuring a peripheral circuit is formed by a process technology using photolithography and dry etching after a MONOS type nonvolatile memory cell is formed. In the process of forming a gate electrode however, unnecessary processing may undesirably be applied to an element such as a MONOS type nonvolatile memory cell already formed in a region other than a peripheral circuit region.

An object of the present invention is to provide a technology capable of improving the production yield of a semiconductor device having nonvolatile memory cells of a sprit gate structure.

Aforementioned and other objects and novel features of the present invention will be obvious from the description and attached drawings in the present specification.

A representative embodiment according to the invention disclosed in the present application is briefly as follows.

The embodiment is a method for manufacturing a semiconductor device having a memory cell region having a memory mat where a plurality of memory cells are formed, a peripheral circuit region, and a scribe region, comprising the steps of: forming a first gate insulation film over a principal face of a semiconductor substrate in the memory cell region; forming a first conductive film and an insulation film in sequence over the first gate insulation film in the memory cell region; forming a plurality of first patterns comprised of a laminated film of a selective gate electrode comprising the first conductive film and the insulation film in a first direction in the memory cell region by processing the insulation film and the first conductive film in sequence; successively, removing the insulation film configuring the upper part of the first pattern located on the outermost side of the memory mat in a second direction perpendicular to the first direction and forming second pattern comprised of the selective gate electrode on the outermost side of the memory mat in the second direction; successively, forming a second gate insulation film with which the first patterns and the second pattern in the memory cell region are covered over the principal face of the semiconductor substrate; forming a second conductive film over the second gate insulation film; leaving the second conductive film over both the side faces of each of the first patterns and both the side faces of the second pattern by applying anisotropic etching to the second conductive film; and removing a part of the second conductive film and forming a memory gate electrode comprising the second conductive film over one side faces of the first patterns and one side face of the second pattern.

An effect obtained through the representative embodiment according to the invention disclosed in the present application is briefly explained as follows.

It is possible to improve the production yield of a semiconductor device having nonvolatile memory cells of a sprit gate structure.

BRIEF DESCRIPTION OF THE DRAWINGS

FIG. 33A and FIG. 33B are sectional views of a substantial part of a memory cell explaining the shapes of a selective gate electrode and a memory gate electrode, in which FIG. 33A is a sectional view of a substantial part explaining the shape of a memory gate electrode formed only over a side face of a selective gate electrode and FIG. 33B is a sectional view of a substantial part explaining the shape of a memory gate electrode formed over a side face of a pattern comprised of a laminated film of a selective gate electrode, a silicon oxide film, and a silicon nitride film.

DETAILED DESCRIPTION

Figure 1:
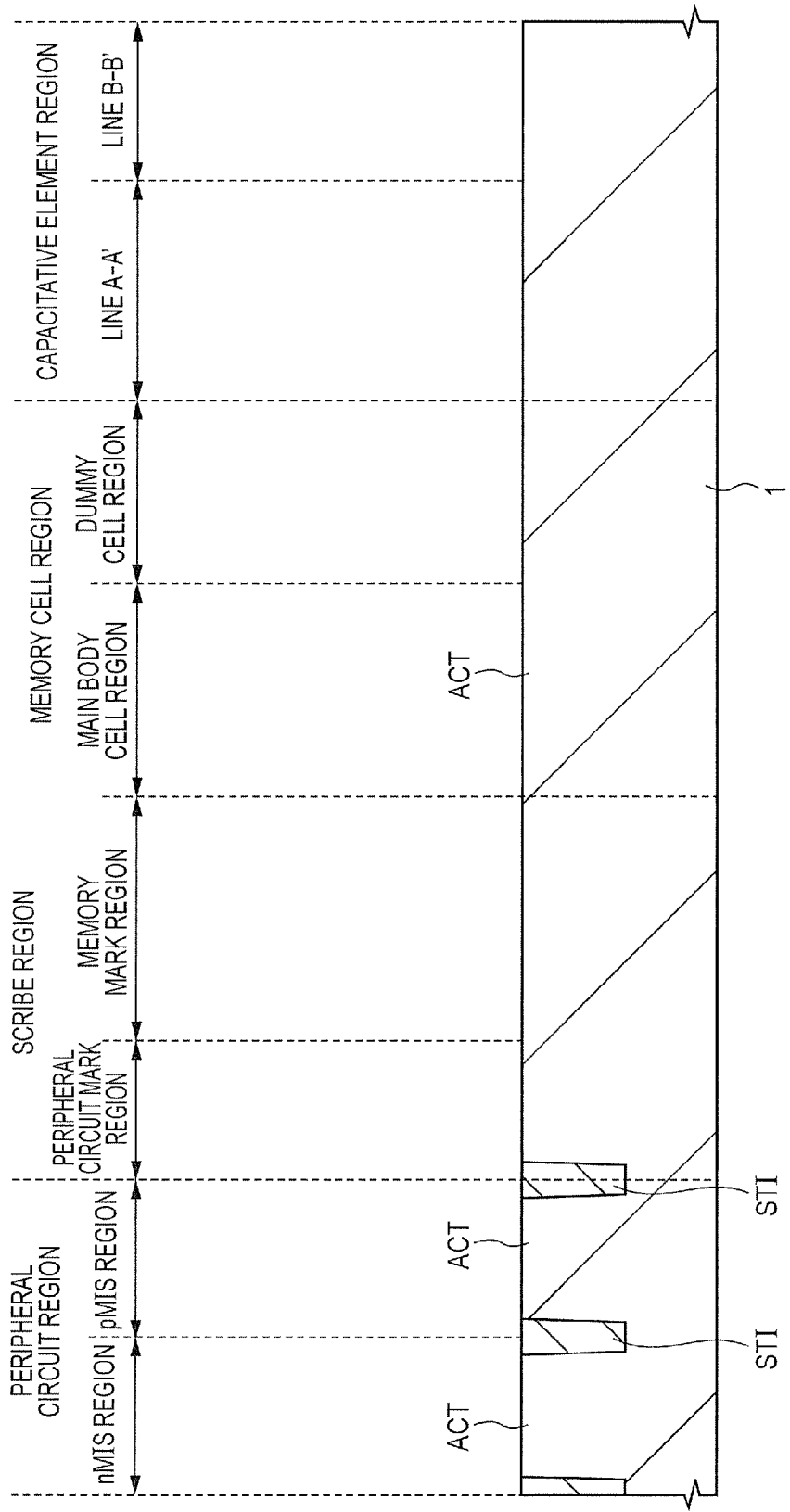
FIG. 1 is a sectional view of a substantial part showing a manufacturing process of a semiconductor device having nonvolatile memory cells according to an embodiment of the present invention.

In the following embodiment, explanations are made in the manner of being divided into plural sections or embodiments for convenience when it is necessary but, unless otherwise specified, they are not unrelated to each other and one is related to another as a modified example, a detail, or a supplemental remark of a part or the whole thereof.

Further, in the following embodiment, when the number of components or the like (including the number of pieces, a numerical value, a quantity, a range, etc.) is mentioned, the number is not particularly limited to the specific number and may be more or less than the specific number unless otherwise specified or obviously limited to the specific number in principle. Furthermore, in the present embodiment, it is needless to say that constituent components (including component steps) are not always essential unless otherwise specified or considered to be essential in principle. Similarly, in the following embodiment, when a shape, positional relationship, etc. of a constituent component or the like are mentioned, a shape or the like which is substantially close or similar to the shape is included unless otherwise specified or considered to be otherwise in principle. The same goes for a numerical value or a range stated above.

In addition, in the drawings used in the following embodiment, hatching may be applied in some cases even in a plan view so as to be easily visible. Further, in the following embodiment, a MISFET (Metal Insulator Semiconductor Field Effect Transistor) representing a field effect transistor is abbreviated as a MIS and an n-channel type MISFET is abbreviated as an nMIS. Furthermore, it goes without saying that a MONOS type memory cell described in the following embodiment is also included in a subordinate concept of a MIS. Moreover, in the following embodiment, when the term "silicon nitride" is referred to, the term includes not only $Si_3N_4$ but also an insulation film comprising a nitride of silicon and having a similar composition. In addition, in the following embodiment, when the term "wafer" is referred to, it means an Si (silicon) monocrystalline wafer mostly and it indicates not only an Si (silicon) monocrystalline wafer but also an SIO (Silicon ON Insulator) wafer, an insulation film substrate over which an integrated circuit is formed, etc.

Further, in a memory mat where a plurality of memory cells are formed, which will be explained in the following embodiment, a memory cell located on the outermost side in a gate longitudinal direction is a dummy memory cell (hereunder referred to as a dummy cell occasionally) not functioning as a memory cell. Then a region where a dummy memory cell is formed is described as a dummy cell region and the region other than the dummy cell region is described as a main body cell region.

Here, in all the drawings for explaining the following embodiment, members having an identical function are represented with an identical code in principle and repetitive explanations are omitted. An embodiment according to the present invention is explained hereunder in detail in reference to drawings.

Technological problems in the manufacturing process of a MONOS type nonvolatile memory cell of a sprit gate structure, which have been clarified by the present inventors, are explained hereunder in reference to FIGS. 28 to 34.

Figure 31:
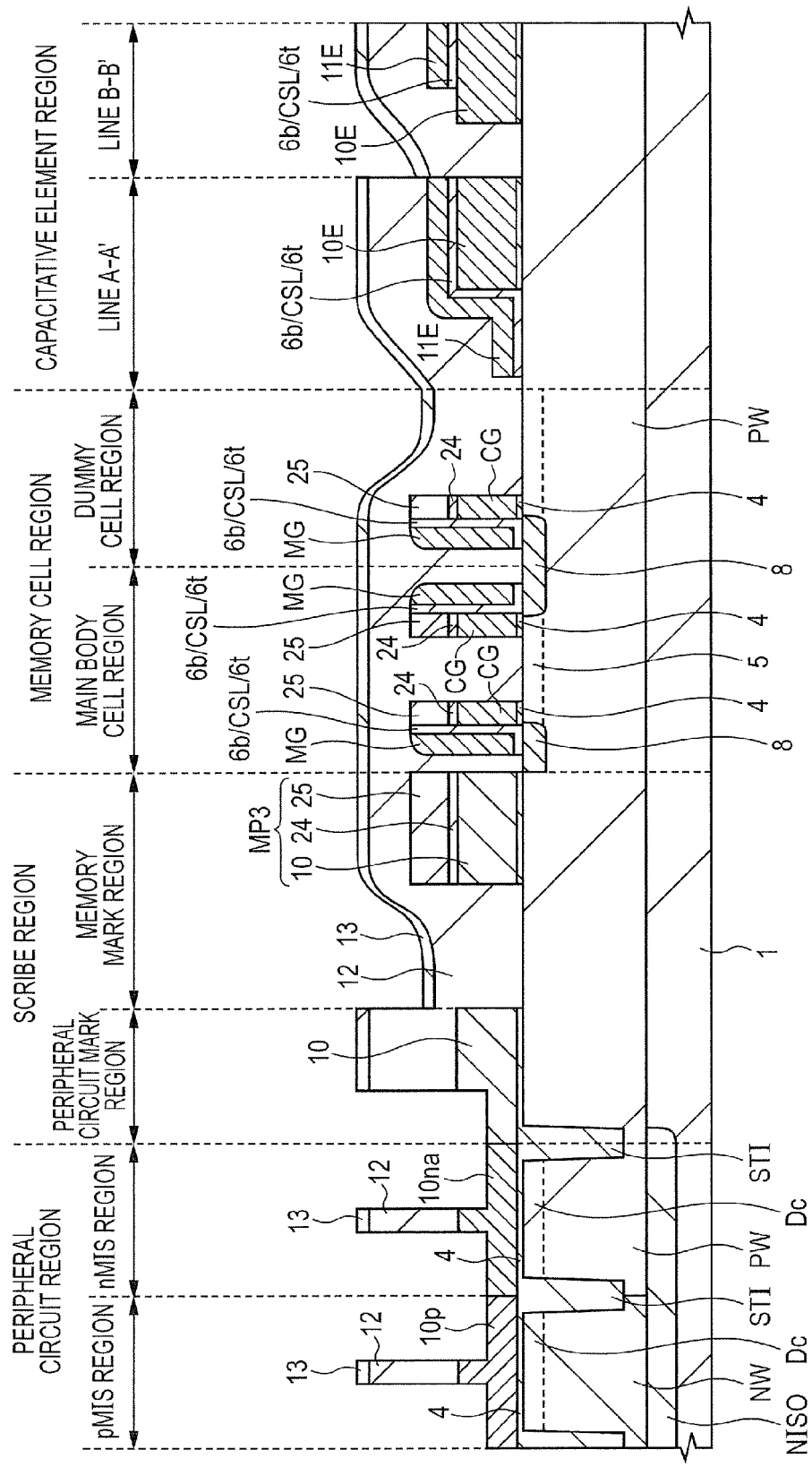
FIG. 31 is a sectional view of the substantial part identical to FIG. 28 in a manufacturing process succeeding to FIG. 30 of a semiconductor device having nonvolatile memory cells.
Figure 32:
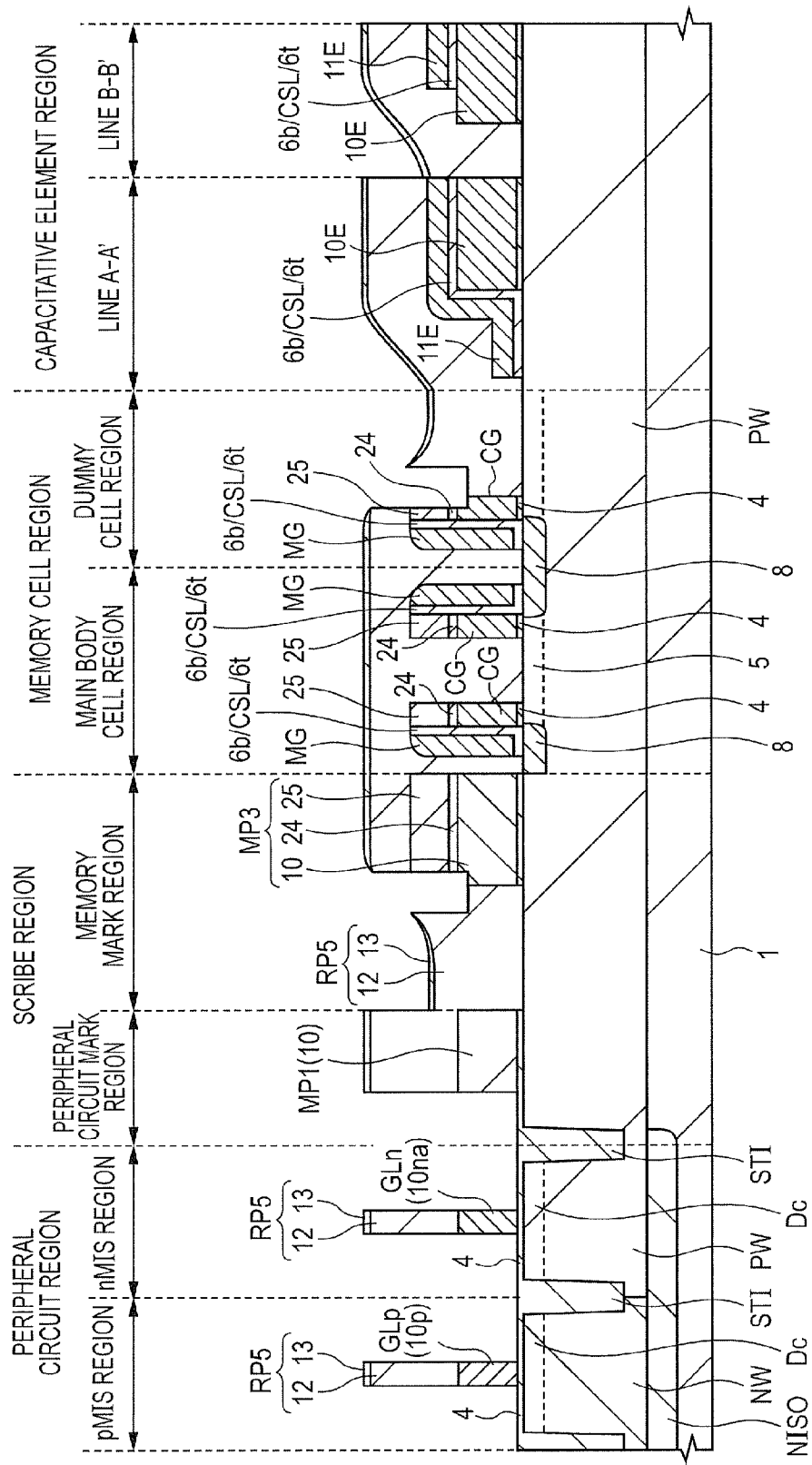
FIG. 32 is a sectional view of the substantial part identical to FIG. 28 in a manufacturing process succeeding to FIG. 31 of a semiconductor device having nonvolatile memory cells.
Figure 33A:
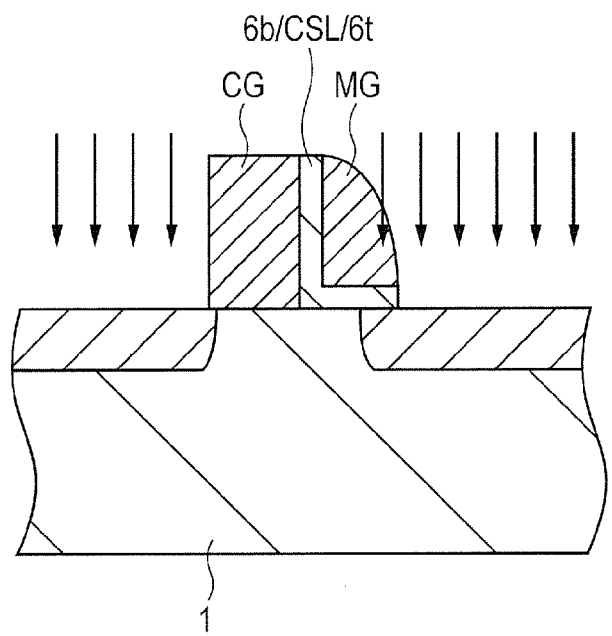
Figure 33B:
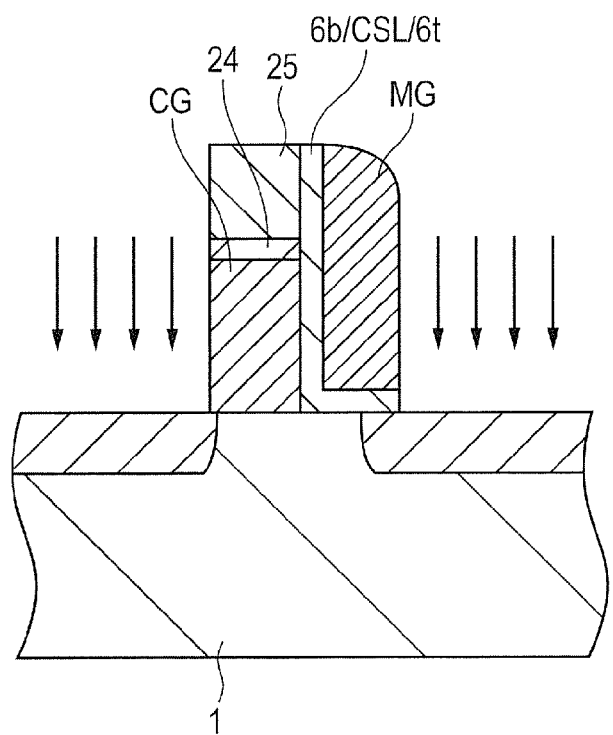
Figure 34:
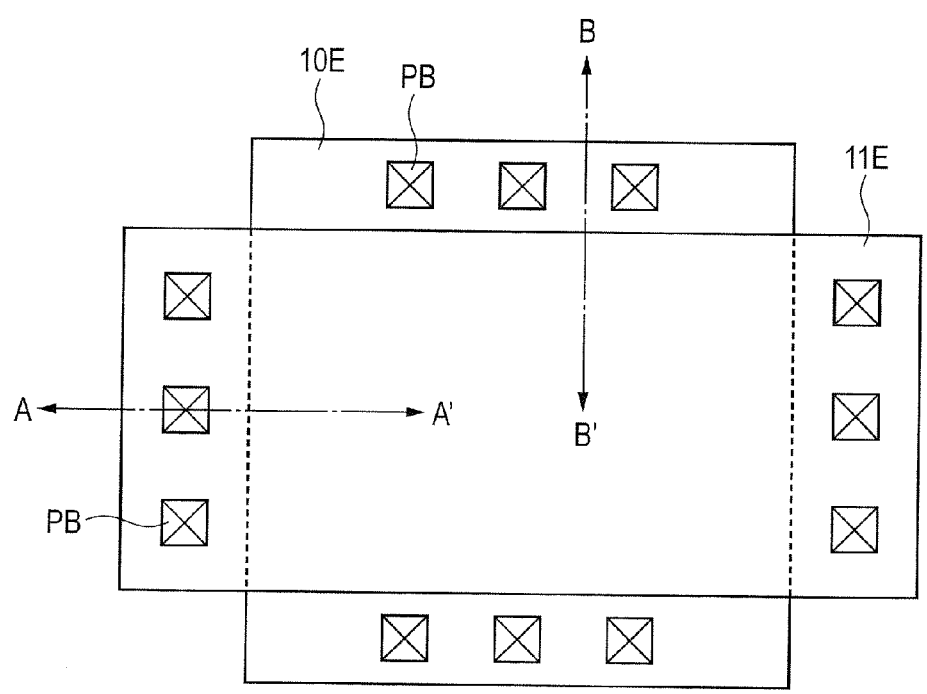
FIG. 34 is a plan view of a substantial part of a capacitative element region.

FIGS. 28 to 32 are sectional views of a substantial part in the manufacturing process of a semiconductor device before the present invention is applied, FIG. 33A and FIG. 33B are sectional views of a substantial part of a memory cell explaining the shapes of a selective gate electrode and a memory gate electrode, and FIG. 34 is a plan view of a substantial part of a capacitative element. In each of FIGS. 28 to 32, a sectional view of the substantial part of a peripheral circuit region (an nMIS region and a pMIS region), a scribe region (a peripheral circuit mark region and a memory mark, region), a memory cell region (a main body cell region and a dummy cell region), and a capacitative element region in the manufacturing process of a semiconductor device is described. In the capacitative element region, a capacitative element having a structure formed by stacking an upper electrode and a lower electrode through a capacitative insulation film is formed and a sectional view of a substantial part at an end of a capacitative element taken on line A-A' shown in FIG. 34 and a sectional view of a substantial part at an end of the capacitative element taken on line B-B' perpendicular to the line A-A' are described in each of FIGS. 28 to 32.

Figure 28:
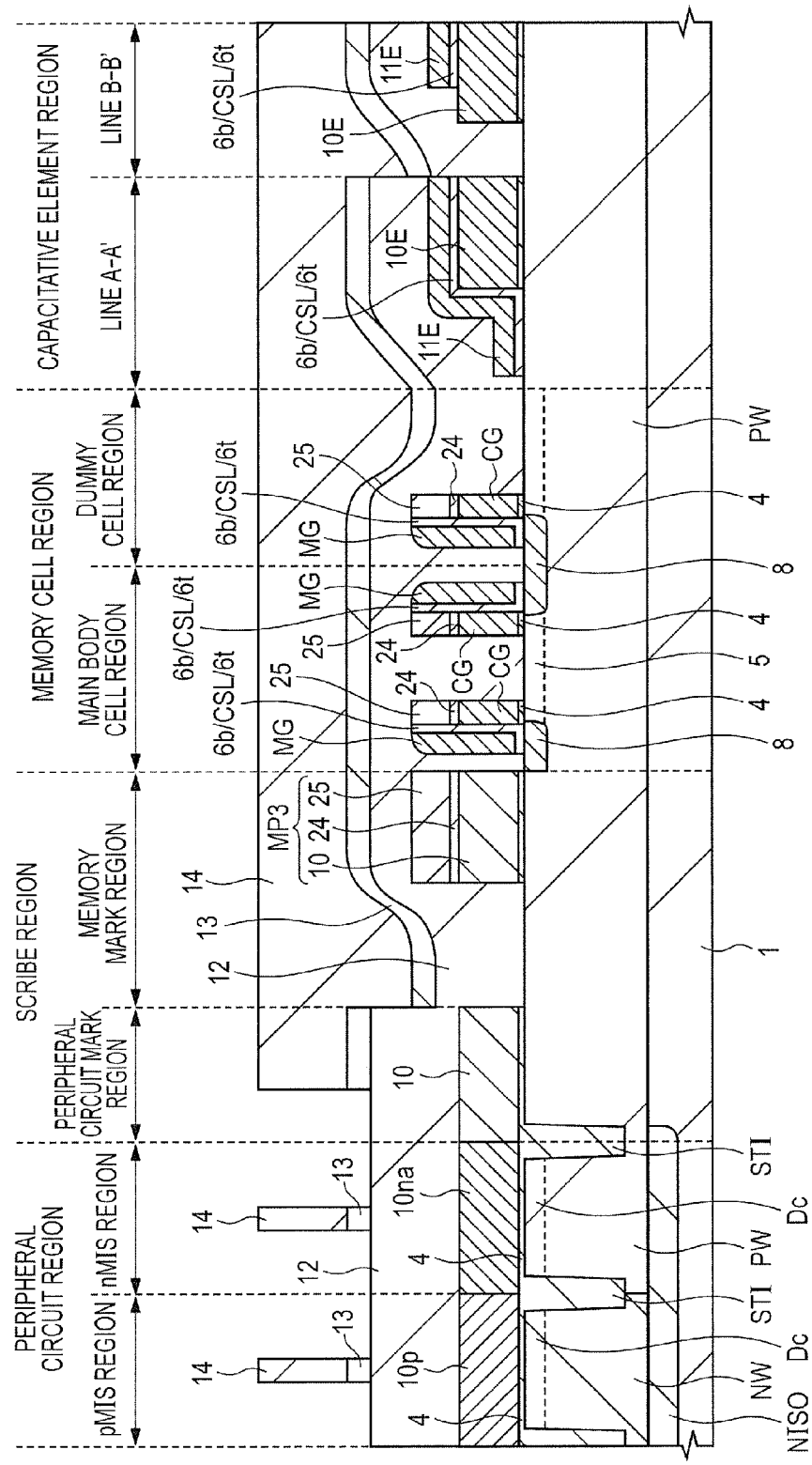
FIG. 28 is a sectional view of a substantial part showing a manufacturing process of a semiconductor device having nonvolatile memory cells before the present invention is applied.

As shown in FIG. 28, in the memory cell region, in both the main body cell region and the dummy cell region, selective gate electrodes CG of selective n-channel type MISFETs are formed and a silicon oxide film 24 and a silicon nitride film 25 are stacked over each of the selective gate electrodes CG. Further, a memory gate electrode of a memory n-channel type MISFET is formed in a self-aligned manner over a side face of a pattern comprised of a laminated film of each of the selective gate electrodes CG, the silicon oxide film 24, and the silicon nitride film 25 through an insulation film (insulation films 6b and 6t and a charge accumulation layer CSL). Each of the selective gate electrodes CG comprises a first conductive film and each of memory gate electrodes MG comprises a second conductive film different from the first conductive film.

The purpose of stacking a silicon oxide film 24 and a silicon nitride film 25 over a selective gate electrode CG is to make a side face of a memory gate electrode MG nearly perpendicular to the principal face of a semiconductor substrate 1.

When a silicon oxide film 24 and a silicon nitride film 25 are not stacked over a selective gate electrode CG, as shown in FIG. 33A, the height from the principal face of a semiconductor substrate 1 to the top face of the selective gate electrode CG is relatively low and hence a memory gate electrode MG formed by a self-alignment method has a shape of expanding toward the principal face of the semiconductor substrate 1. On this occasion, when impurities are introduced into the semiconductor substrate 1 by an ion implantation method with the memory gate electrode MG as a mask, the impurities are introduced also into the semiconductor substrate 1 under an end of the memory gate electrode MG. As a result, the drawback of varying the operation characteristic of a memory cell occurs.

In contrast, when a silicon oxide film 24 and a silicon nitride film 25 are stacked over a selective gate electrode CG, as shown in FIG. 33B, the height from the principal face of a semiconductor substrate 1 to the top face of the silicon nitride film 25 is relatively high and hence a side face of a memory gate electrode MG formed by a self-alignment method is nearly perpendicular to the principal face of the semiconductor substrate 1. On this occasion, even when impurities are ion-implanted with the memory gate electrode MG as a mask, the impurities are hardly introduced into the semiconductor substrate 1 under an end of the memory gate electrode MG. As a result, the drawback of varying the operation characteristic of a memory cell does not occur.

Then, as shown in FIG. 28, the first conductive film (a conductive film 10) processed to a peripheral circuit mark pattern MP1 and a memory mark pattern MP3 are formed in the peripheral circuit mark region and the memory mark region of the scribe region respectively in a succeeding process. The memory mark pattern MP3 comprises a laminated film of the first conductive film (conductive film 10), the silicon oxide film 24, and the silicon nitride film 25. Further, a capacitative element is formed in the capacitative element region. The capacitative element has a structure formed by stacking a lower electrode 10E comprising the first conductive film and an upper electrode 11E comprising the second conductive film through a capacitative insulation film (insulation films 6b and 6t and a charge accumulation layer CSL).

In the state, a gate electrode of an n-channel type MISFET and a gate electrode of a p-channel type MISFET, each of which has a gate length of about 100 nm, are formed in the peripheral circuit region by processing the first conductive film (an n-type conductive film 10na and a p-type conductive film 10p) formed in the peripheral circuit region, by photolithography and dry etching. Since fine gate electrodes having a gate length of about 100 nm are formed, a multilayer resist method allowing a high resolving power is used. Here, a three-layered resist film comprising a lower layer resist film 12, a resist intermediate layer 13, and an upper layer resist film 14 is used in the multilayer resist method. The lower layer resist film 12 and the upper layer resist film 14 comprise an organic resin. Further, the resist intermediate layer 13 comprises an organic material and an example is an SOG (Spin On Glass) film.

The lower layer resist film 12 is a resist for alleviating level difference but, in the memory cell region, the lower layer resist film 12 forms a steep level difference at a part of a dummy memory cell located on the outermost side of a memory mat in the gate length direction. This is caused by the fact that the silicon oxide film 24 and the silicon nitride film 25 are stacked over the selective gate electrode CG, the height from the principal face of the semiconductor substrate 1 to the top face of the silicon nitride film 25 is relatively high, and a side face of a pattern comprised of the laminated film of the selective gate electrode CG, the silicon oxide film 24, and the silicon nitride film 25 and a side face of the memory gate electrode MG are formed nearly perpendicularly to the principal face of the semiconductor substrate 1.

Likewise, in the scribe region too, the lower layer resist film 12 forms a steep level difference at an end of the memory mark pattern MP3. This is caused by the fact that the memory mark pattern MP3 is comprised of the laminated film of the first conductive film (the conductive film 10), the silicon oxide film 24, and the silicon nitride film 25, the height from the principal face of the semiconductor substrate 1 to the top face of the silicon nitride film 25 is relatively high, and a side face of the memory mark pattern MP3 is formed nearly perpendicularly to the principal face of the semiconductor substrate 1.

When the lower layer resist film 12 has a steep level difference, the coverability of the resist intermediate layer 13 formed over the steep level difference deteriorates and resultantly the thickness of the resist intermediate layer 13 formed over the steep level difference may reduce to not more than a half of the thickness of the resist intermediate layer 13 formed over a flat face in some cases.

In the capacitative element region too, the level difference of the lower layer resist film 12 is formed at an end of a capacitative element but the level difference can take the shape of a gentle slope. A plan view of a substantial part of a capacitative element is shown in FIG. 34. The lower electrode 10E and the upper electrode 11E configuring a capacitative element have rectangular shapes different from each other and there are an overlap region where the lower electrode 10E and the upper electrode 11E planarly overlap with each other and a non-overlap region where the lower electrode 10E and the upper electrode 11E do not planarly overlap with each other. That is, the length of the upper electrode 11E is larger than the length of the lower electrode 10E in the direction of the line A-A' in the figure and the length of the lower electrode 10E is larger than the length of the upper electrode 11E in the direction of the line B-B' perpendicular to the line A-A' in the figure. Consequently, a stepwise level difference is formed at an end of the capacitative element and hence the lower layer resist film 12 can form a gentle level difference at the end of the capacitative element as stated earlier.

Successively, over the resist intermediate layer 13, a pattern of the upper layer resist film 14 is formed by photolithography. A pattern of the resist intermediate layer 13 is formed by etching the resist intermediate layer 13 with the pattern of the upper layer resist film 14 as a mask.

Figure 29:
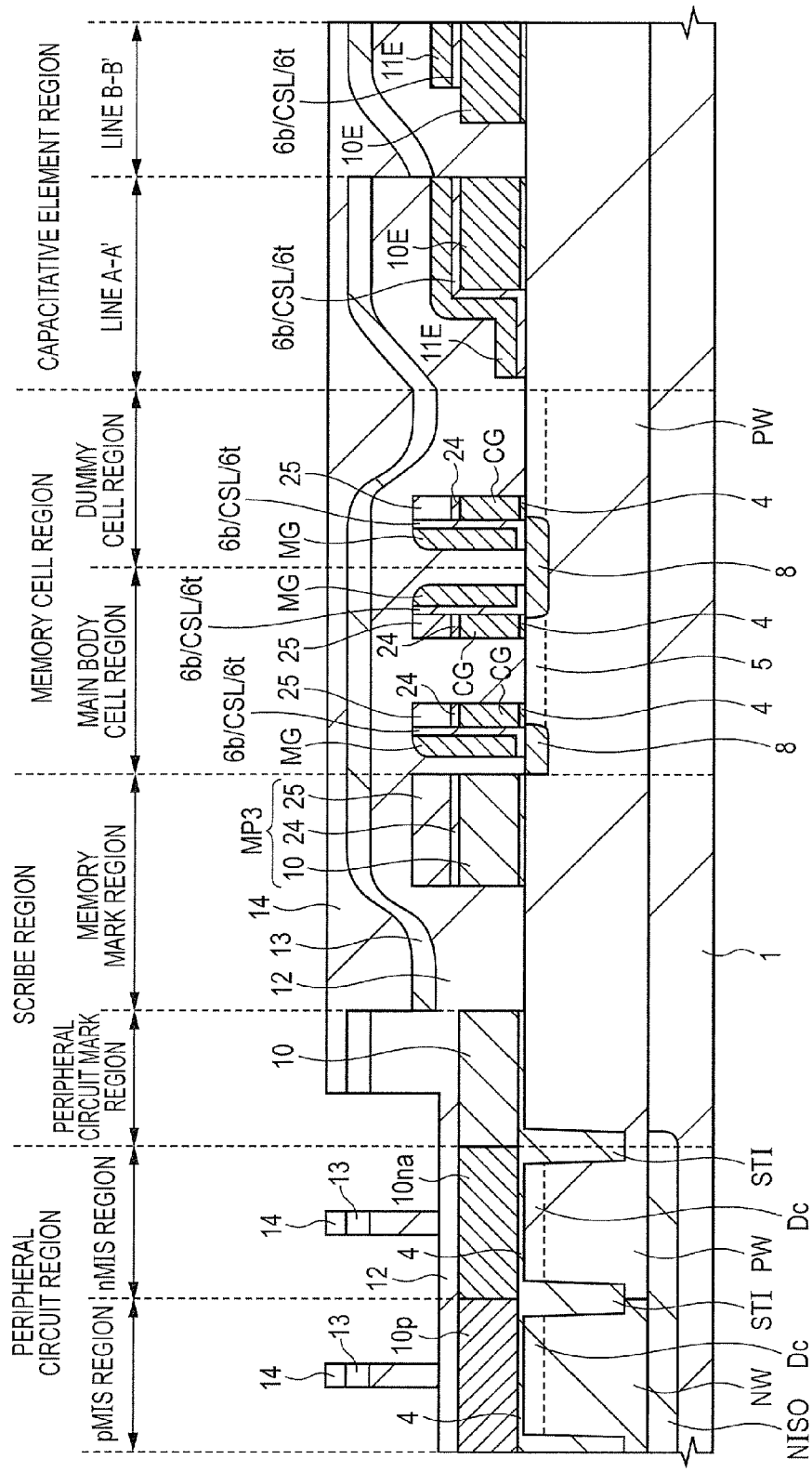
FIG. 29 is a sectional view of the substantial part identical to FIG. 28 in a manufacturing process succeeding to FIG. 28 of a semiconductor device having nonvolatile memory cells.

Successively, as shown in FIG. 29, a pattern of the lower layer resist film 12 is formed by etching the lower layer resist film 12.

Figure 30:
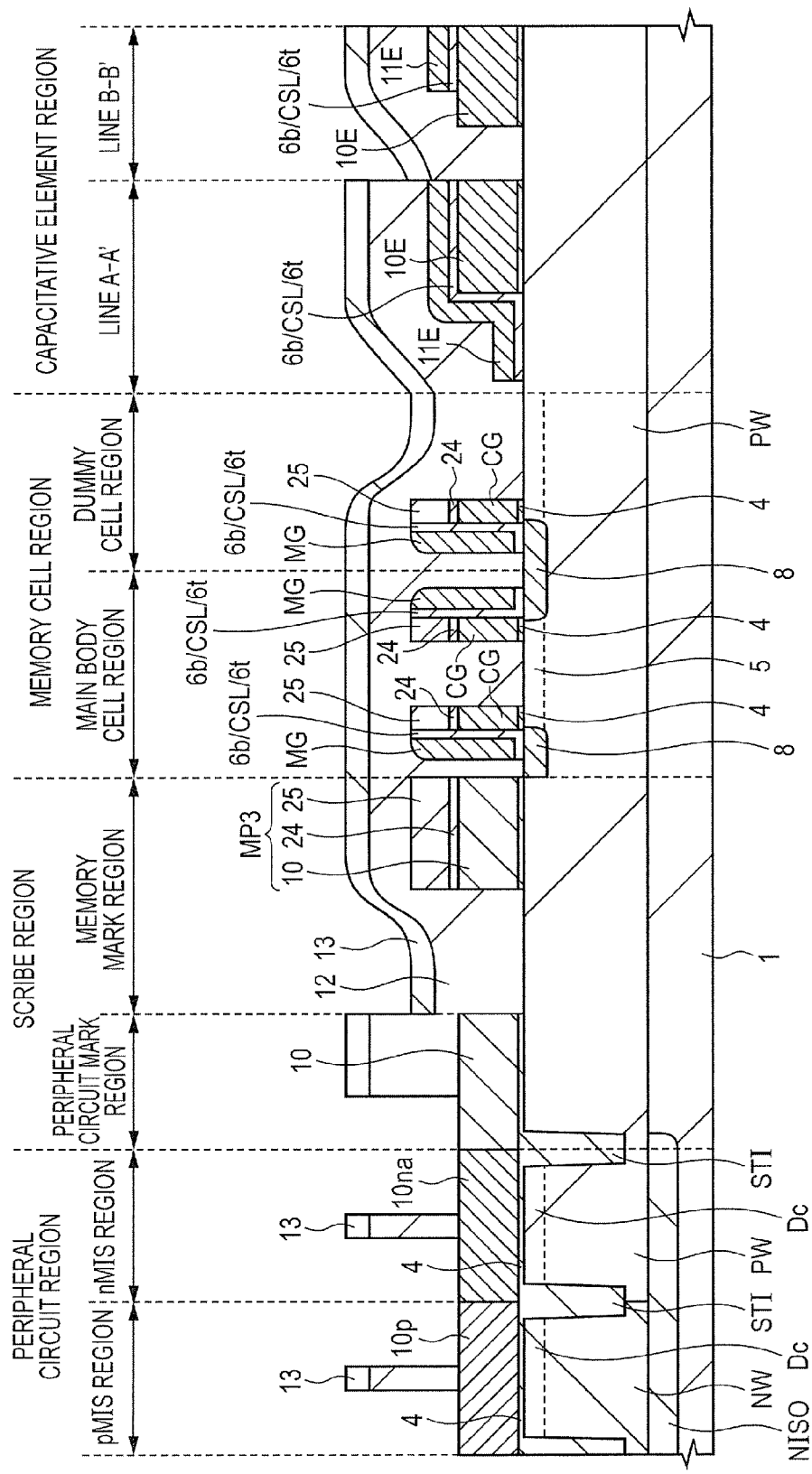
FIG. 30 is a sectional view of the substantial part identical to FIG. 28 in a manufacturing process succeeding to FIG. 29 of a semiconductor device having a nonvolatile memory cell.

Here, as shown in FIG. 30, the upper layer resist film 14 disappears when the lower layer resist film 12 is processed. When the upper layer resist film 14 disappears, the resist intermediate layer 13 is exposed and hence the resist intermediate layer 13 is also etched and reduces the thickness to some extent.

Successively, as shown in FIG. 31, the first conductive film (the conductive film 10, the n-type conductive film 10na, and the p-type conductive film 10p) in the peripheral circuit region and the peripheral circuit mark region of the scribe region is etched with the resist intermediate layer 13 as a mask. In the etching, the resist intermediate layer 13 is also etched and reduces the thickness. Although the resist intermediate layer 13 formed over a planar face does not disappear, the resist intermediate layer 13 being formed over the lower layer resist film 12 and having a steep level difference as stated earlier may disappear sometimes while the first conductive film (the conductive film 104 the n-type conductive film 10na, and the p-type conductive film 10p) is etched.

When the resist intermediate layer 13 disappears, as shown in FIG. 32, the lower layer resist film 12 is etched from sites where the resist intermediate layer 13 disappears and moreover films of further lower layers exposed from the lower layer resist film 12 are also etched undesirably. As a result, in the memory cell region, the silicon nitride film 25, the silicon oxide film 24, and the selective gate electrode CG configuring the dummy memory cell located on the outermost side of the memory mat in the gate length direction are etched and the production yield deteriorates by the defective shape of the dummy memory cell and the appearance of foreign substances. Further, in the scribe region, the silicon nitride film 25, the silicon oxide film 24, and the first conductive film (the conductive film 10) configuring the memory mask pattern MP3 are etched, the defective shape of the memory mask pattern MP3 is caused, and a mask pattern cannot be registered in the succeeding process.

It is also possible to make the lower layer resist film 12 have a gentle level difference by allocating a dummy pattern around the memory mat in the memory cell region but it is preferable not to allocate the dummy pattern in order to prevent malfunction in a memory cell using a high voltage. Further, it is also possible to make the lower layer resist film 12 have a gentle level difference by allocating a dummy pattern around the memory mark pattern MP3 in the scribe region but it is preferable not to allocate the dummy pattern in order to prevent the false recognition of an exposure device.

Embodiment

Figure 16:
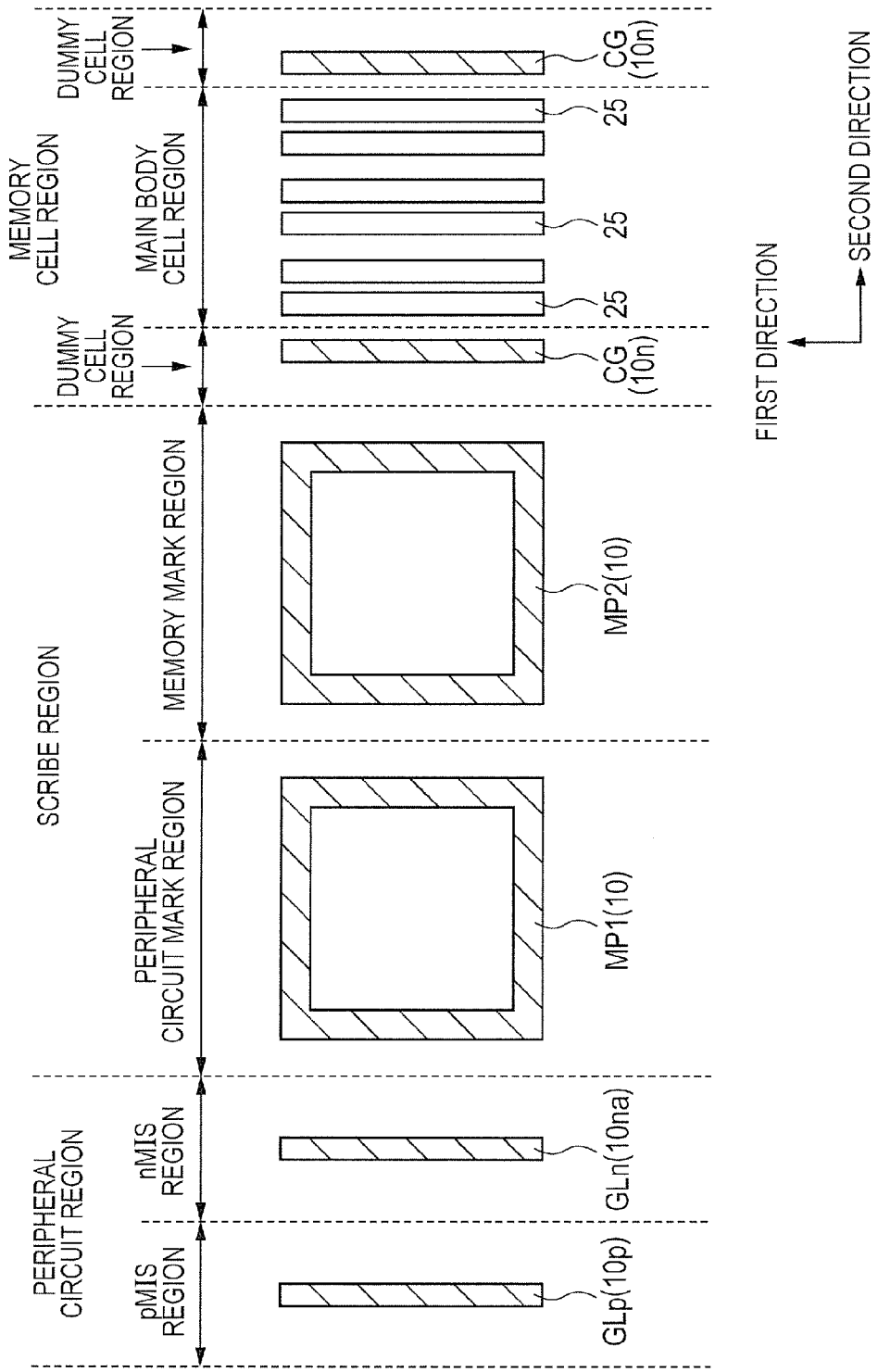
FIG. 16 is a schematic plan view of a semiconductor device according to an embodiment of the present invention viewed from above after gate electrodes in a peripheral circuit region, mark patterns in a scribe region, and selective gate electrodes in a memory cell region are formed.
Figure 17:
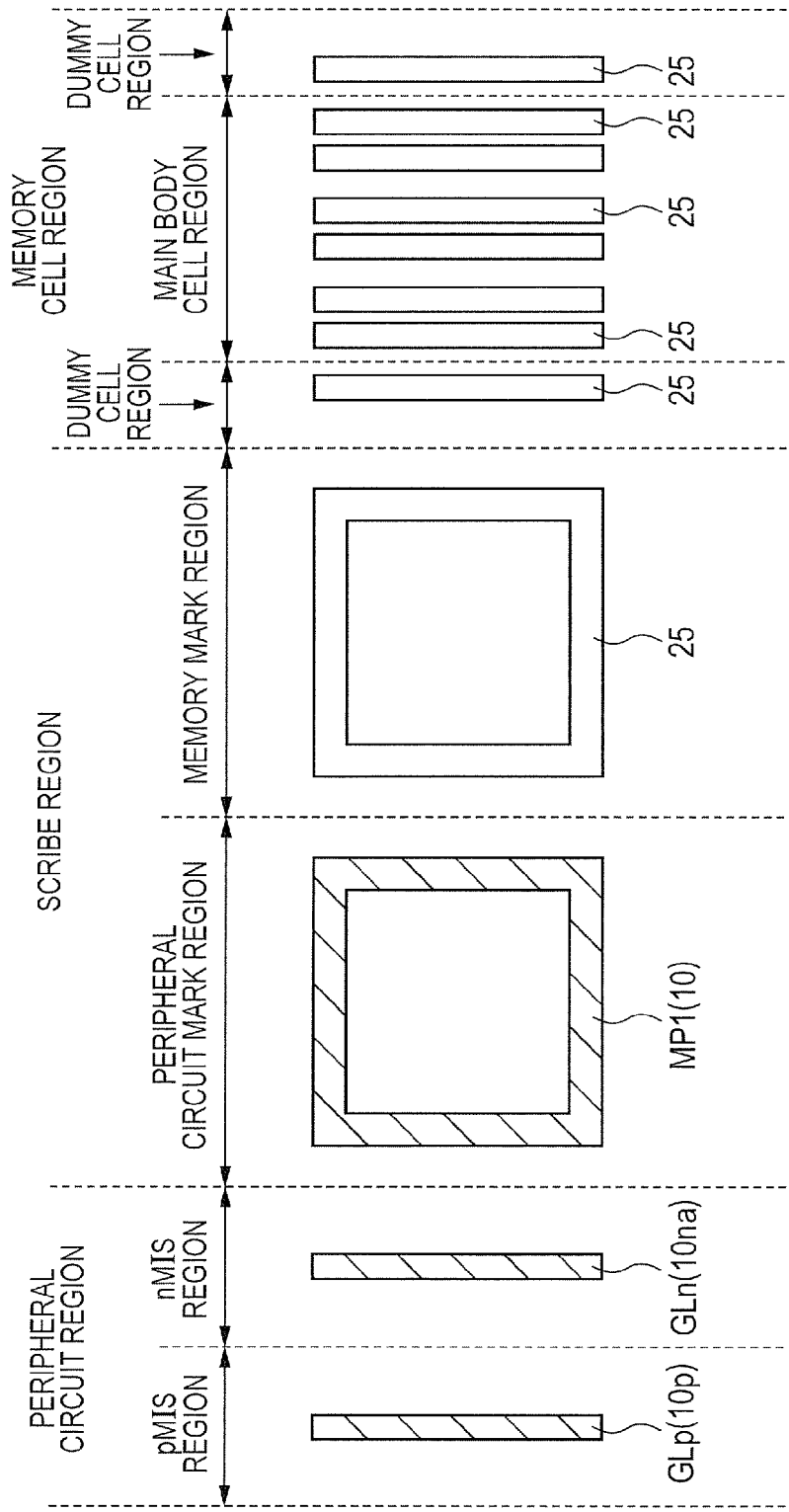
FIG. 17 is a schematic plan view of a semiconductor device before the present invention is applied viewed from above after gate electrodes in a peripheral circuit region, mark patterns in a scribe region, and selective gate electrodes in a memory cell region are formed.

An example of a manufacturing method of a semiconductor device having nonvolatile memory cells according to the embodiment of the present invention is explained in the sequence of processes in reference to FIGS. 1 to 27. Each of FIGS. 1 to 15 and 18 to 27 is a sectional view of substantial parts of a peripheral circuit region (an nMIS region and a pMIS region), scribe region (a peripheral circuit mark region (second region) and a memory mark region (first region)), a memory cell region (a main body cell region and a dummy cell region), and a capacitative element region in a manufacturing process of a semiconductor device according to the present embodiment. A sectional view of an nMIS and a pMIS in the gate length direction is shown in the peripheral circuit region and a sectional view of nonvolatile memory cells, each of which comprises a selective nMIS and a memory nMIS, in the gate length direction is shown in the memory cell region. FIG. 16 is a schematic plan view of a semiconductor device according to the present embodiment viewed from above after gate electrodes in the peripheral circuit region, mark patterns in the scribe region, and selective gate electrodes in the memory cell region are formed. FIG. 17 is a schematic plan view of a semiconductor device before the present invention is applied viewed from above after gate electrodes in the peripheral circuit region, mark patterns in the scribe region, and selective gate electrodes in the memory cell region are formed.

A plurality of nonvolatile memory cells are formed in an arrayed manner in the memory cell region. A MISFET formed in the peripheral circuit region configures a processor such as a CPU, a logic circuit, an input/output circuit, a decoder, a booster circuit, a peripheral circuit of a memory such as a sense amplifier, etc. Although a low voltage system nMIS and a low voltage system pMIS are shown as examples here, a high voltage system nMIS and a high voltage system pMIS can also be formed likewise. Further, in the capacitative element region, sectional view of a substantial part at an end of a capacitative element taken on line A-A' shown in FIG. 28 stated earlier and a sectional view of a substantial part at another end of a capacitative element taken on line B-B' perpendicular to the line A-A' shown in FIG. 28 stated earlier are shown.

Firstly, as shown in FIG. 1, for example trench-shaped element isolation sections STI, active regions ACT allocated so as to be surrounded by the element isolation sections STI, etc. are formed over the principal face of a semiconductor substrate 1 (at this stage, a thin plate of a semiconductor having a nearly circular shape in a planar view called a semiconductor wafer). That is, an insulation film is embedded into isolation trenches by forming the isolation trenches at prescribed locations over a semiconductor substrate 1, successively depositing an isolation film of silicon oxide for example over the principal face of the semiconductor substrate 1, and further polishing the isolation film by a CMP (Chemical Mechanical Polishing) method or the like so that the isolation film may remain only in the isolation trenches. The element isolation sections STI are formed in this way.

Figure 2:
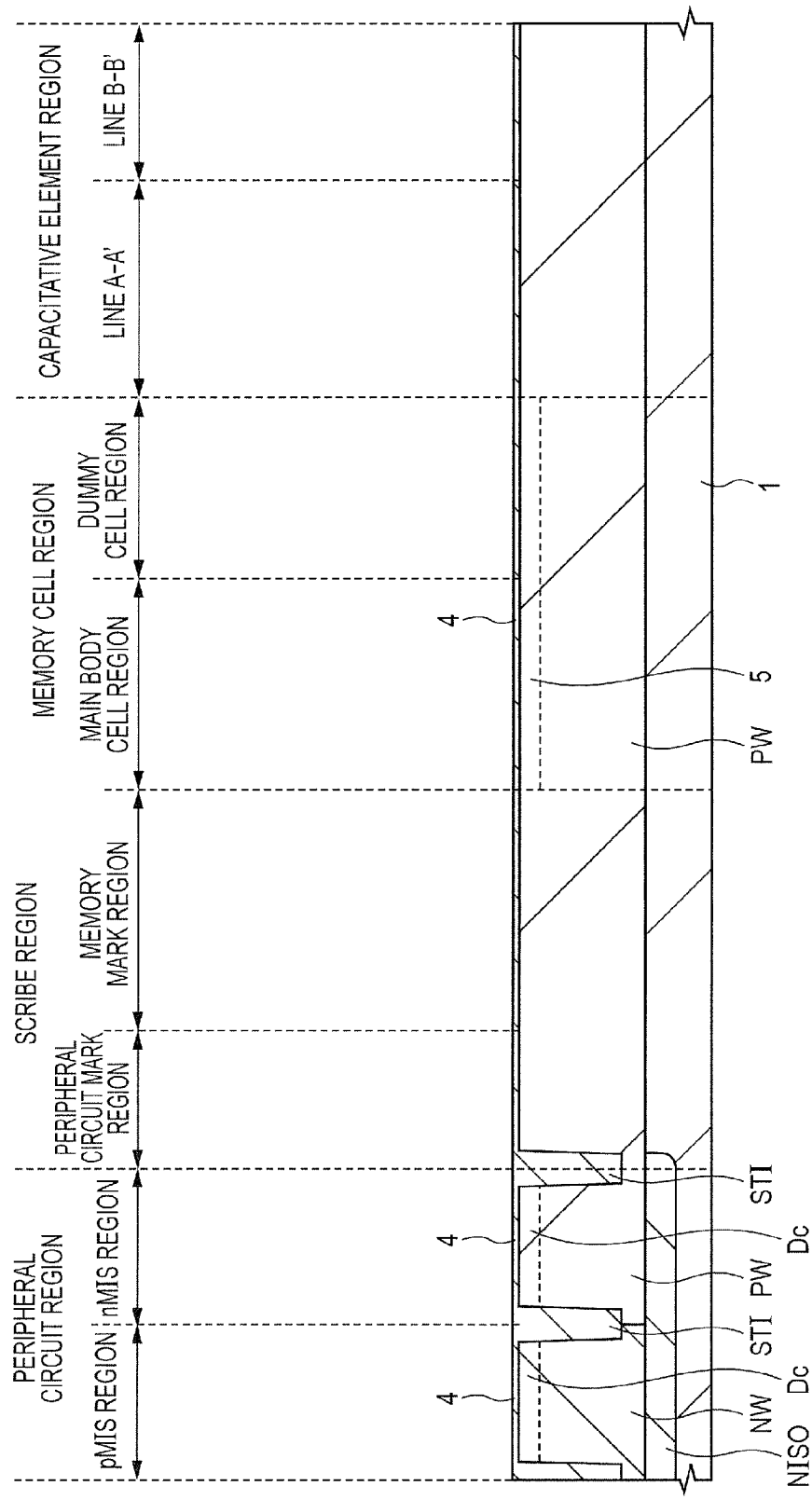
FIG. 2 is a sectional view of the substantial part identical to FIG. 1 in a manufacturing process succeeding to FIG. 1 of a semiconductor device having nonvolatile memory cells.

Successively, as shown in FIG. 2, an embedded n-well NISO is formed by selectively ion-implanting n-type impurities into the semiconductor substrate 1 in the peripheral circuit region. Successively, p-wells PW are formed by selectively ion-implanting p-type impurities into the semiconductor substrate 1 in the memory cell region and the nMIS region of the peripheral circuit region and an n-well NW is formed by selectively ion-implanting n-type impurities into the semiconductor substrate 1 in the pMIS region of the peripheral circuit region.

Successively, p-type impurities, for example boron, are ion-implanted selectively into the semiconductor substrate 1 in the memory cell region. In this way, a p-type semiconductor region 5 for forming a channel of a selective nMIS is formed over the semiconductor substrate 1 in the memory cell region. Likewise, prescribed impurities are ion-implanted into the semiconductor substrate 1 in the nMIS region and the pMIS region of the peripheral circuit region respectively. In this way, semiconductor regions Dc for forming channels are formed in the semiconductor substrate 1 in the nMIS region and the pMIS region of the peripheral circuit region respectively.

Successively, by applying oxidation treatment to the semiconductor substrate 1, a gate insulation film (first gate insulation film) 4 about 1 to 5 nm in thickness comprising silicon oxide for example is formed over the principal face of the semiconductor substrate 1. The gate insulation film 4 is not limited to comprising silicon oxide but may be a high-permittivity film comprising hafnium oxide (HfSiON) or the like.

Figure 3:
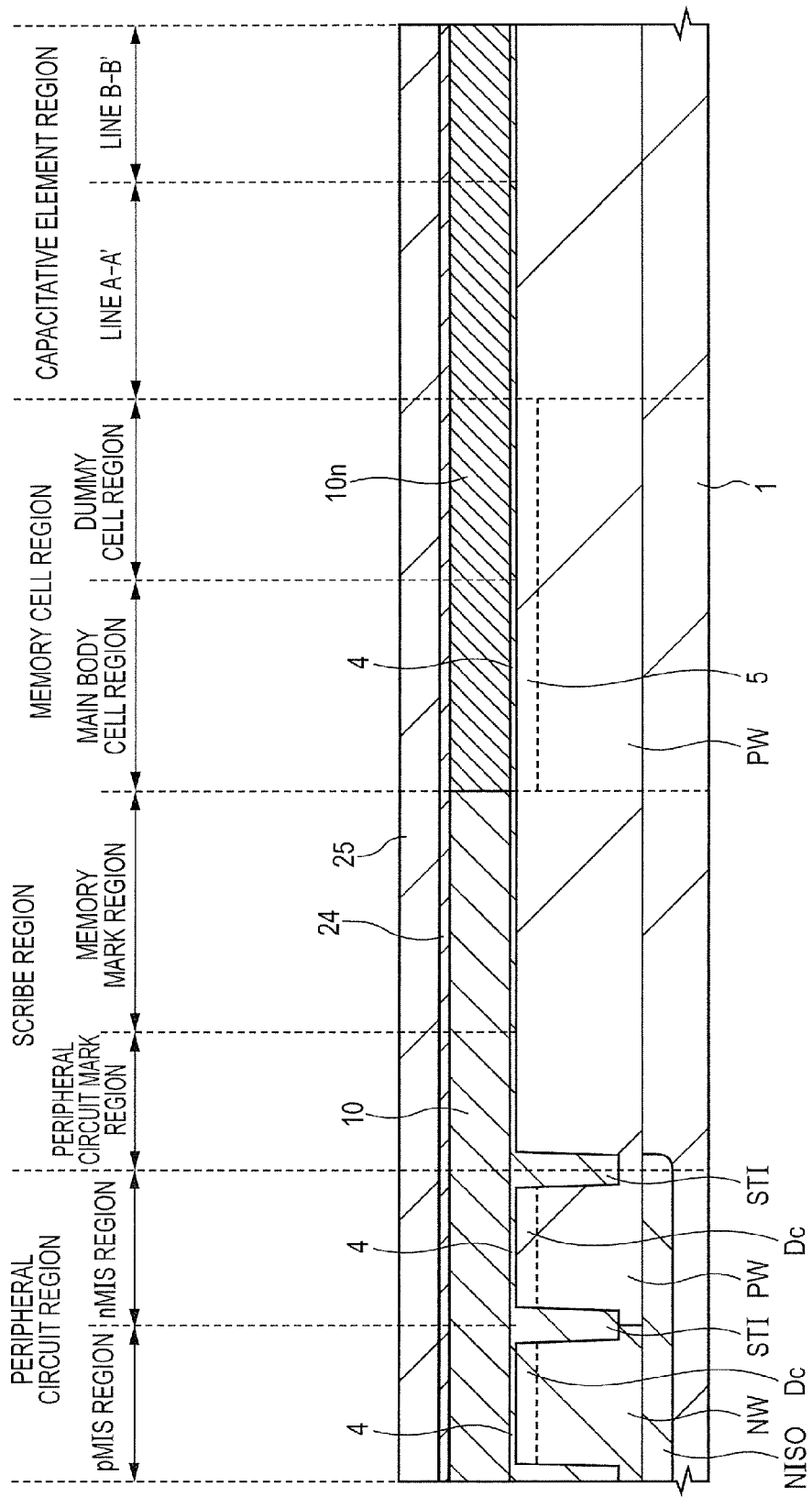
FIG. 3 is a sectional view of the substantial part identical to FIG. 1 in a manufacturing process succeeding to FIG. 2 of a semiconductor device having nonvolatile memory cells.

Successively, as shown in FIG. 3, a first conductive film, for example a conductive film 10 comprising amorphous silicon, is deposited over the gate insulation film 4 by a CVD (Chemical Vapor Deposition) method. The thickness of the conductive film 10 is about 100 nm for example. Successively, an n-type conductive film 10n comprising the first conductive film is formed by introducing n-type impurities into the conductive film 10 in the memory cell region and the capacitative element region by an ion implantation method or the like. Successively, a silicon oxide film 24 and a silicon nitride film 25 are formed in sequence over the conductive film 10 and the n-type conductive film 10n. The thickness of the silicon oxide film 24 is about 10 nm for example and the thickness of the silicon nitride film 25 is about 70 nm for example.

Figure 4:
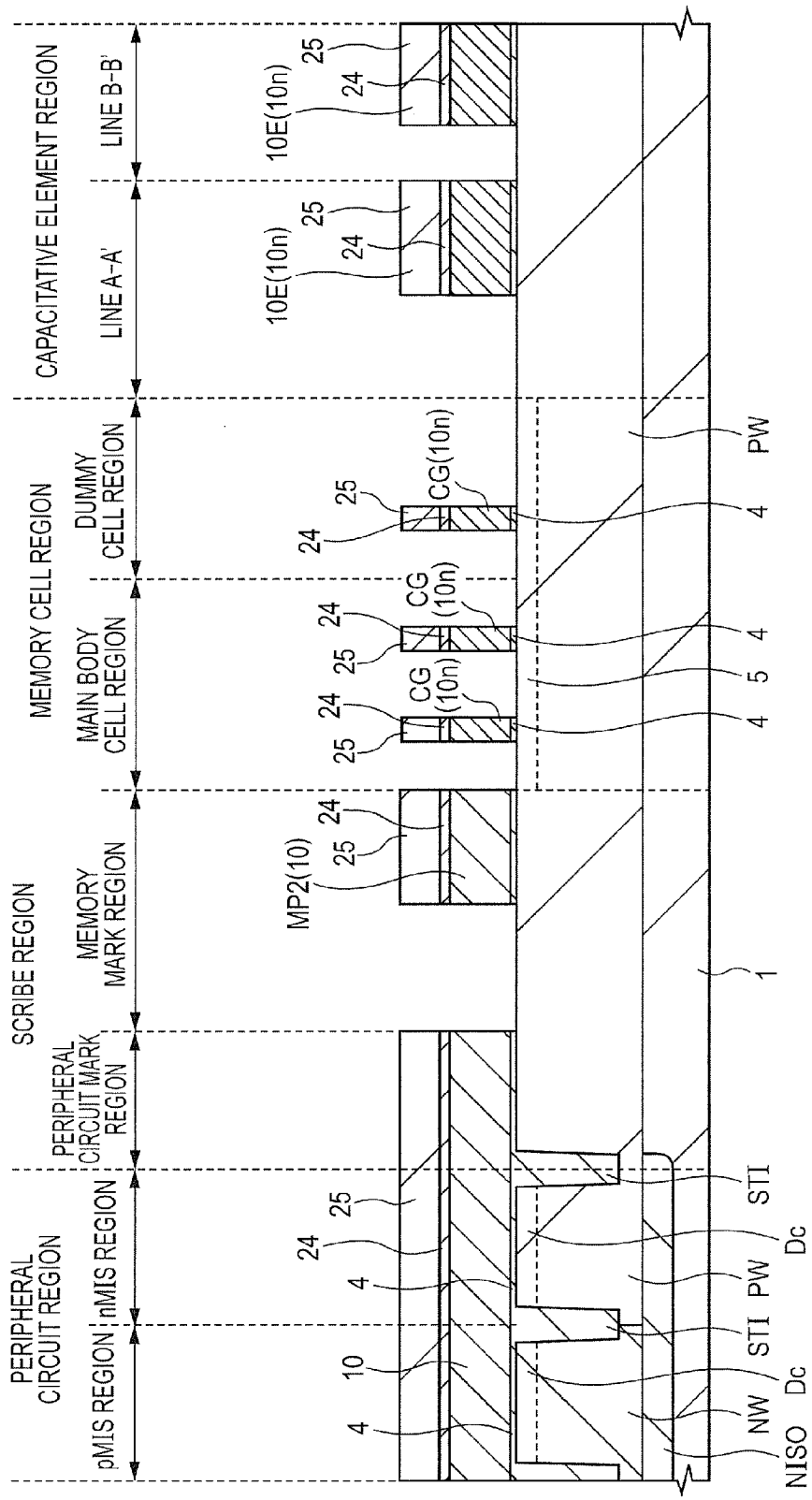
FIG. 4 is a sectional view of the substantial part identical to FIG. 1 in a manufacturing process succeeding to FIG. 3 of a semiconductor device having nonvolatile memory cells.

Successively, as shown in FIG. 4, the silicon nitride film 25, the silicon oxide film 24, and the n-type conductive film 10n in the memory cell region and the capacitative element region and the silicon nitride film 25, the silicon oxide film 24, and the conductive film 10 in the scribe region are patterned in sequence by photolithography and dry etching.

In this way, a plurality of patterns (first patterns), each of which is comprised of a laminated film of a selective gate electrode CG of a selective nMIS comprising the n-type conductive film 10n, the silicon oxide film 24, and the silicon nitride film 25, are formed in a first direction (the direction of the gate width) in the memory cell region. The length (gate length) of each of the selective gate electrodes CG in a second direction (the direction of the gate length) perpendicular to the first direction is about 80 nm for example and the interval between adjacent selective gate electrodes CG is about 160 nm for example.

Further, a pattern (third pattern) comprised of a laminated film of the conductive film 10, the silicon oxide film 24, and the silicon nitride film 25 is formed in the memory mark region (first region) of the scribe region. Furthermore, a lower electrode 10E comprising the n-type conductive film 10n is formed in the capacitative element region.

Figure 5:
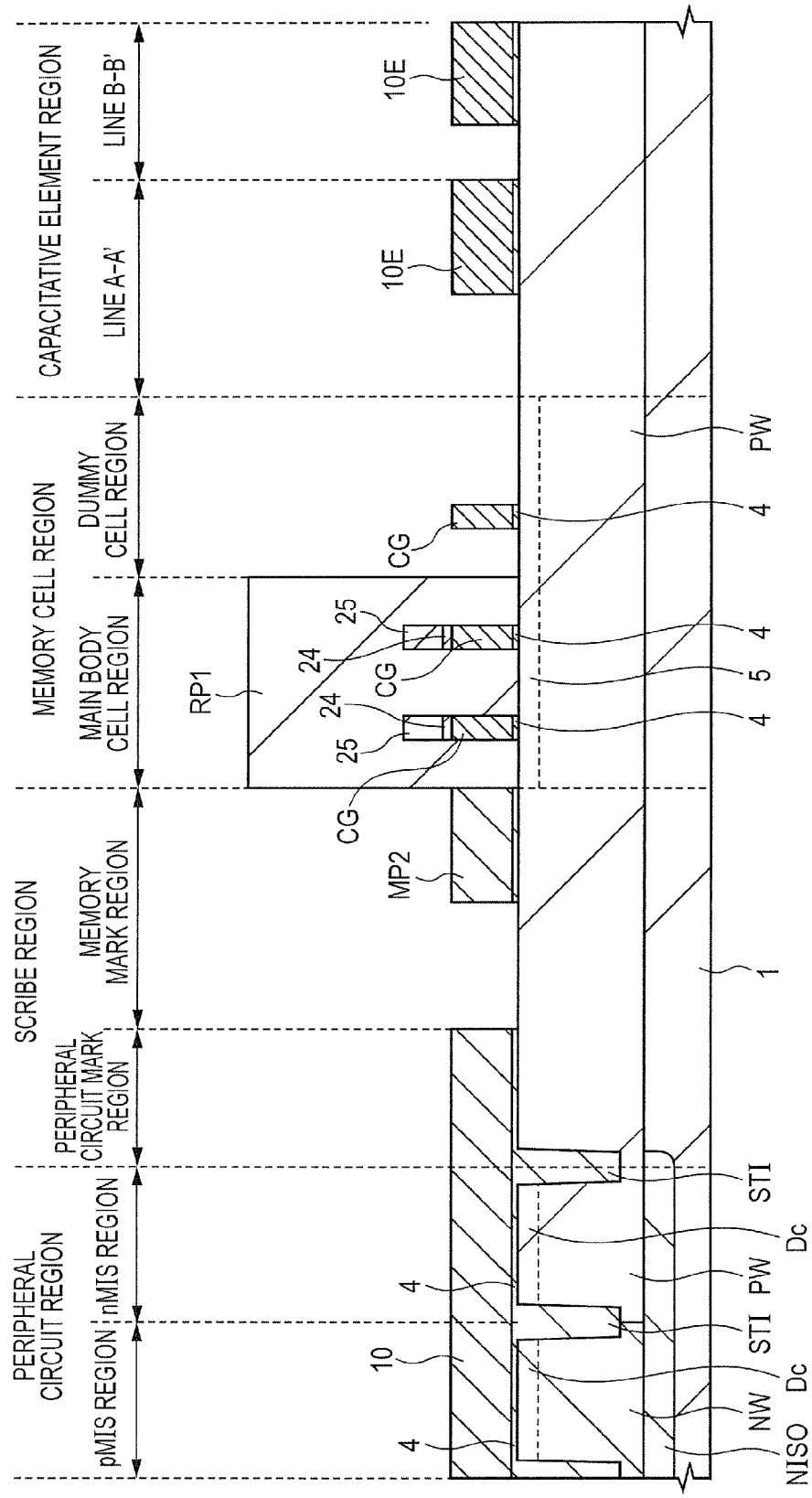
FIG. 5 is a sectional view of the substantial part identical to FIG. 1 in a manufacturing process succeeding to FIG. 4 of a semiconductor device having nonvolatile memory cells.

Successively, as shown in FIG. 5, the main body cell region of the memory cell region is covered with a photoresist pattern RP1 and the silicon nitride film 25 and the silicon oxide film 24 existing in the peripheral circuit region, the dummy cell region of the memory cell region, the scribe region, and the capacitative element region are removed by dry etching. On this occasion, in the dummy cell region located on the outermost side of the memory mat in the second direction, the silicon nitride film 25 and the silicon oxide film 24 existing over the selective gate electrode CG are removed and a pattern (second pattern) comprised of the selective gate electrode CG is formed.

Further, a memory mark pattern MP2 (fourth pattern) comprising the conductive film 10 is formed in the memory mark region of the scribe region. The memory mark pattern MP2 is a register mark used in a photolithography process for forming a photoresist pattern acting as a mask when impurities are ion-implanted into the semiconductor substrate 1 in the memory cell region.

Here, although the memory mark pattern MP2 formed in the scribe region is formed over the principal face of the semiconductor substrate 1 through the gate insulation film 4 in the present embodiment, it may also be formed over the element isolation section STI.

Figure 6:
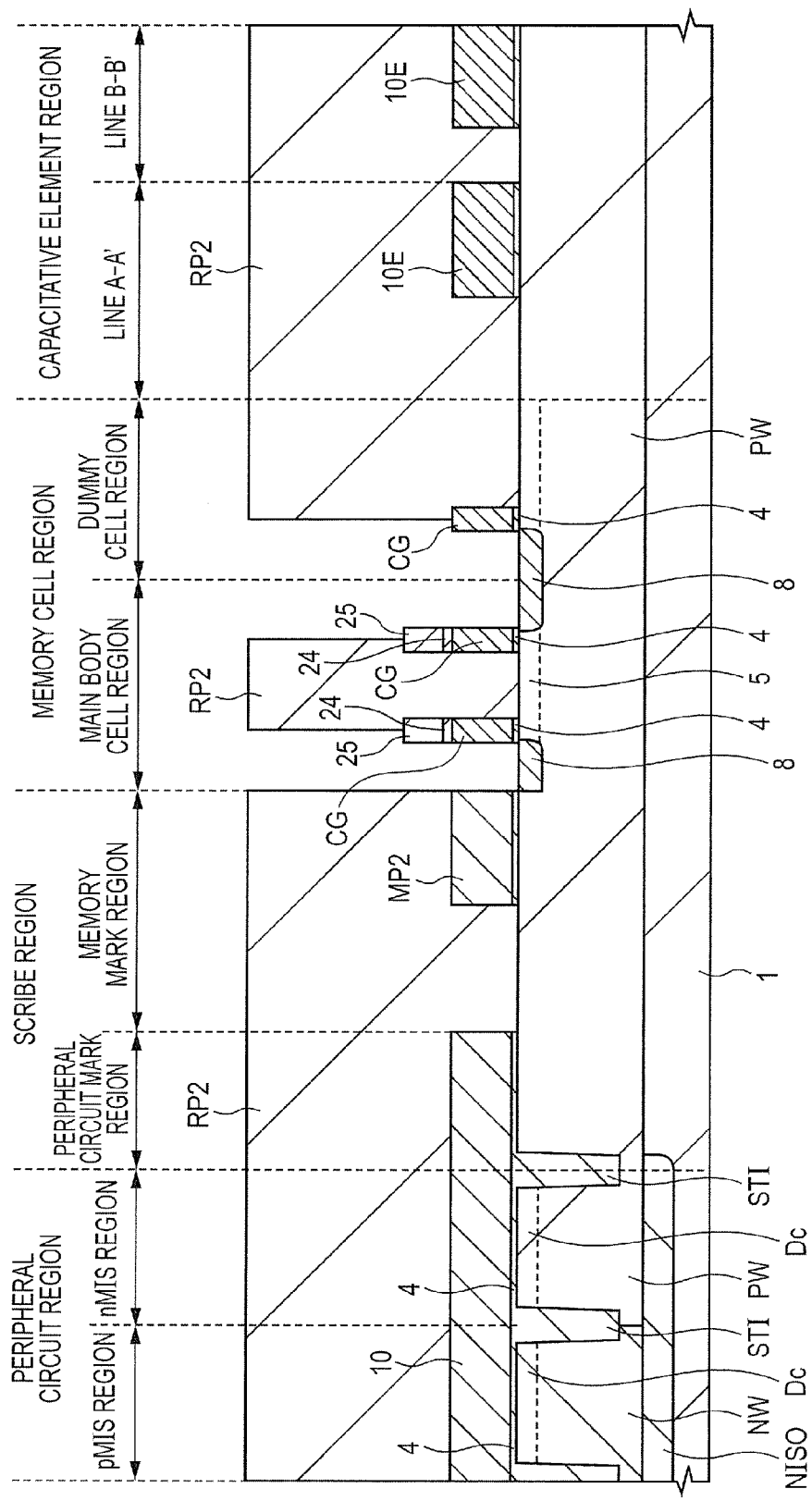
FIG. 6 is a sectional view of the substantial part identical to FIG. 1 in a manufacturing process succeeding to FIG. 5 of a semiconductor device having nonvolatile memory cells.

Successively, as shown in FIG. 6, after the photoresist pattern RP1 is removed, n-type semiconductor regions 8 for forming a channel of a memory nMIS are formed over the principal face of the semiconductor substrate 1 in the memory cell region by ion-implanting n-type impurities, for example arsenic or phosphorus, with the selective gate electrodes CG and a photoresist pattern RP2 as a mask. The memory mark pattern MP2 formed in the scribe region is used as a register mark when the photoresist pattern RP2 is formed.

Figure 7:
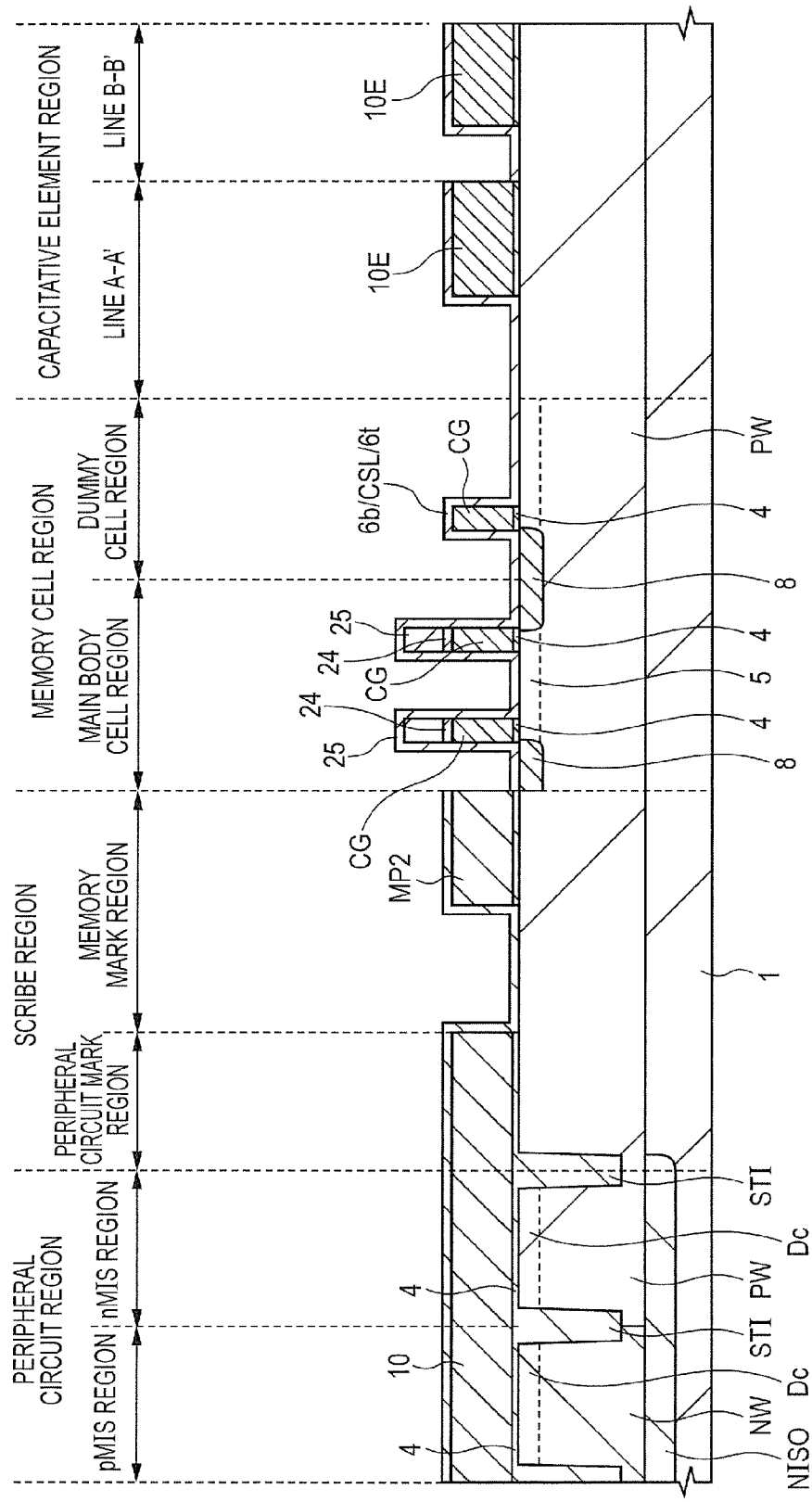
FIG. 7 is a sectional view of the substantial part identical to FIG. 1 in a manufacturing process succeeding to FIG. 6 of a semiconductor device having nonvolatile memory cells.

Successively, as shown in FIG. 7, after the photoresist pattern RP2 is removed, over the principal face of the semiconductor substrate 1, an insulation film 6b comprising silicon oxide for example is formed as an insulation film (second gate insulation film), a charge accumulation layer CSL comprising silicon nitride for example is formed as an insulation film having a trap level, and an insulation film 6t comprising silicon oxide for example is formed as an insulation film, in sequence. The insulation film 6b is formed by a thermal oxidation method or an ISSG (In-Situ Steam Generation) oxidation method for example, the charge accumulation layer CSL is formed by a CVD method for example, and the insulation film 6t is formed by a CVD method or an ISSG oxidation method for example. The total thickness of the insulation films 6b and 6t and the charge accumulation layer CSL is about 20 nm for example. Further, the insulation films 6b and 6t may comprise silicon oxide containing nitrogen and, as the charge accumulation layer CSL, a high-permittivity film comprising aluminum oxide (alumina), hafnium oxide, or tantalum oxide, those having permittivities higher than silicon nitride, may be used.

Figure 8:
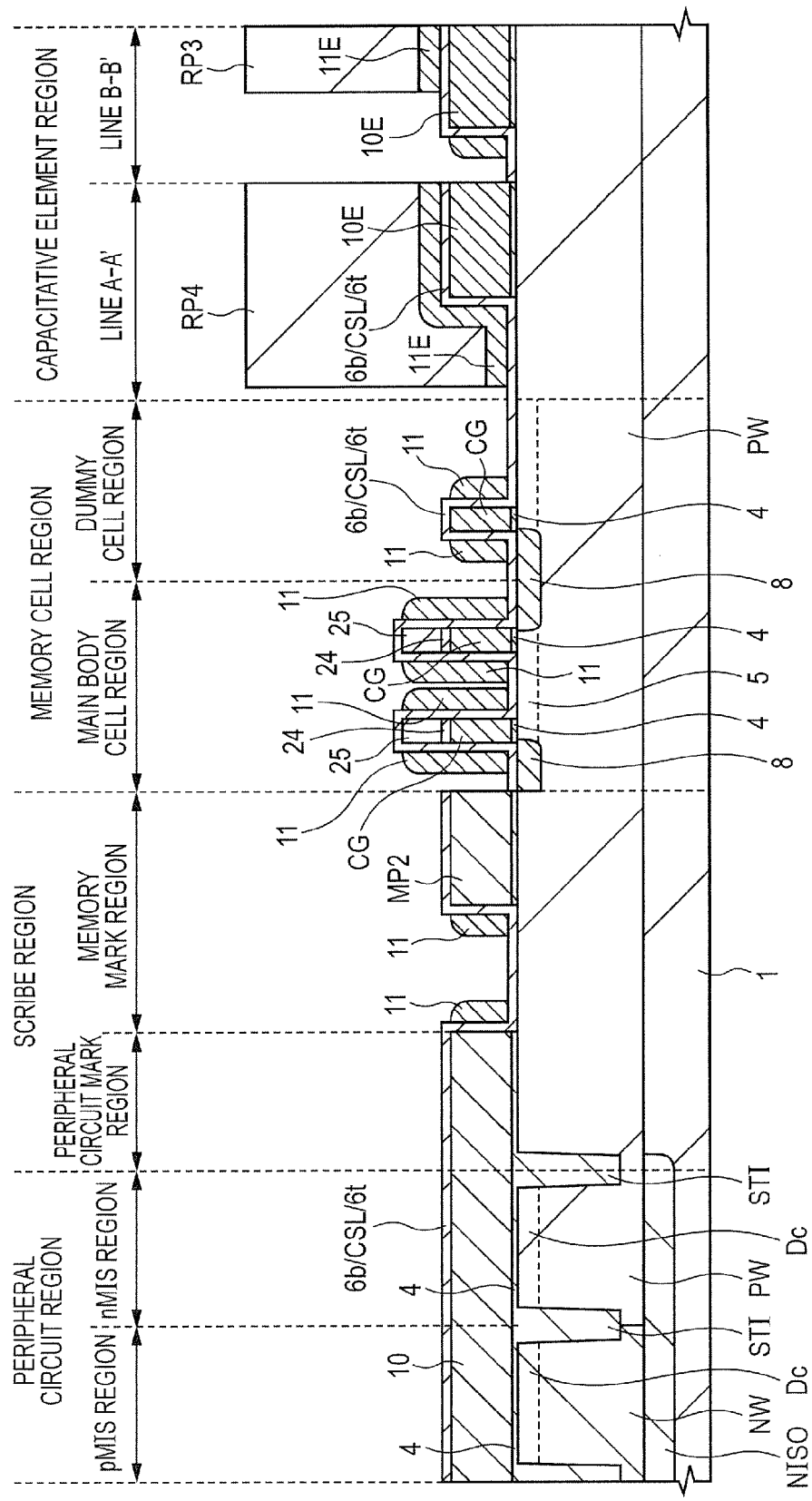
FIG. 8 is a sectional view of the substantial part identical to FIG. 1 in a manufacturing process succeeding to FIG. 7 of a semiconductor device having nonvolatile memory cells.

Successively, as shown in FIG. 8, a second conductive film (not shown in the figure) comprising low-resistance polycrystalline silicon is deposited over the principal face of the semiconductor substrate 1. The second conductive film is formed by a CVD method and the thickness thereof is about 50 nm for example.

Successively, the second conductive film is processed by photolithography and anisotropic dry etching. In this way, in the main body cell region of the memory cell region, sidewalls 11 are formed over both the side faces of the pattern comprised of the laminated film of each of the selective gate electrodes CG, the silicon oxide film 24, and the silicon nitride film 25 through the insulation films 6b and 6t and the charge accumulation layer CSL. On this occasion, sidewalls 11 are formed also over both the side faces of the pattern comprised of the selective gate electrode CG in the dummy region located on the outermost side of the memory mat in the second direction through the insulation films 6b and 6t and the charge accumulation layer CSL.

Simultaneously, in the capacitative element region, an upper electrode 11E is formed by covering the second conductive film with a photoresist pattern RP3 through the insulation films 6b and 6t and the charge accumulation layer CSL.

Figure 9:
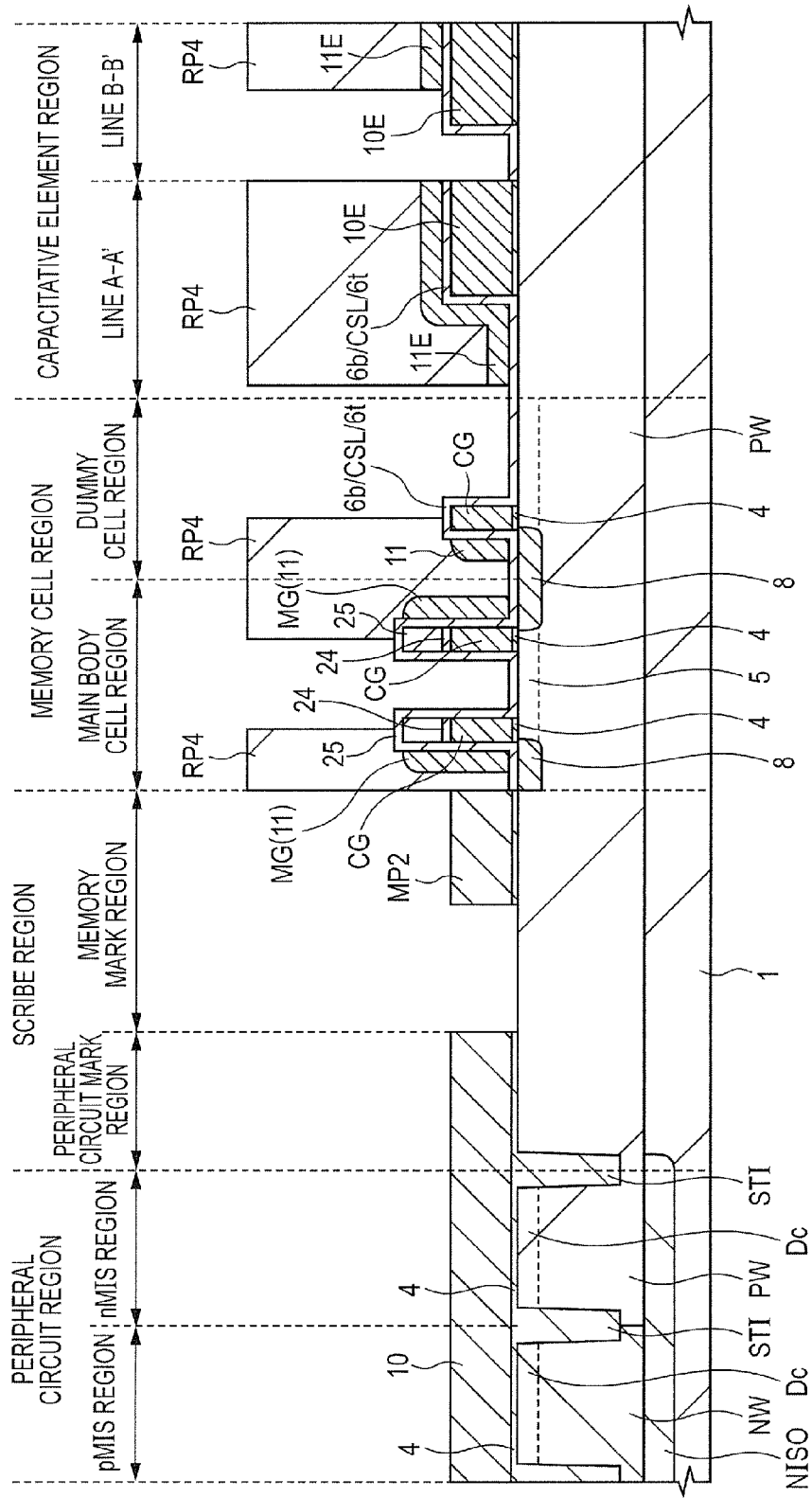
FIG. 9 is a sectional view of the substantial part identical to FIG. 1 in a manufacturing process succeeding to FIG. 8 of a semiconductor device having nonvolatile memory cells.

Successively, as shown in FIG. 9, after the photoresist pattern RP3 is removed, with a photoresist pattern RP4 as a mask, the sidewalls 11 exposed from the photoresist pattern RP4 are removed by dry etching. In this way, memory gate electrodes MG of the memory nMIS are formed over one side face of the pattern comprised of the laminated layer of each of the selective gate electrodes CG, the silicon oxide film 24, and the silicon nitride film 25 in the main body region of the memory cell region and one side face of the pattern comprised of the selective gate electrode CG in the dummy cell region located on the outermost side of the memory mat in the second direction. The gate length of each of the memory gate electrodes MG is about 65 nm for example.

Figure 10:
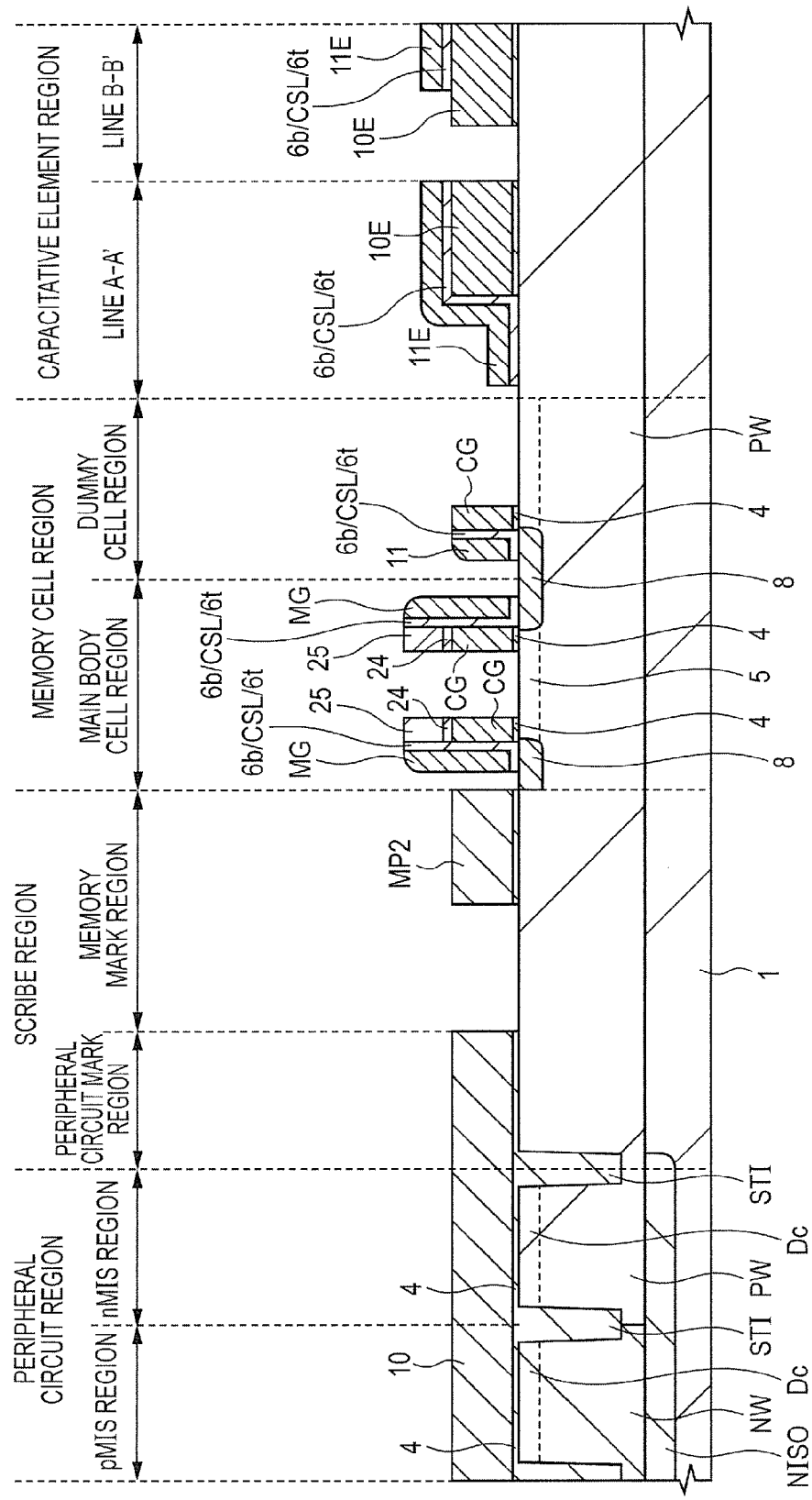
FIG. 10 is a sectional view of the substantial part identical to FIG. 1 in a manufacturing process succeeding to FIG. 9 of a semiconductor device having nonvolatile memory cells.

Successively, as shown in FIG. 10, after the photoresist pattern RP4 is removed, the insulation films 6b and 6t and the charge accumulation layer CSL existing between each of the selective gate electrodes CG and each of the memory gate electrodes MG and between the semiconductor substrate 1 and each of the memory gate electrodes MG in the memory cell region and between the lower electrode 10E and the upper electrode 11E in the capacitative element region are left and the insulation films 6b and 6t and the charge accumulation layer CSL in the other regions are etched selectively.

In the capacitative element region, a capacitative element comprising a lower electrode 10E comprising the first conductive film that is a layer identical to the selective gate electrodes CG and an upper electrode 11E comprising the second conductive film that is a layer identical to the memory gate electrodes MG is formed with the insulation films 6b and 6t and the charge accumulation layer CSL as a capacitative insulation film (dielectric film). The capacitative element configures a charge pump circuit used for an electric power source circuit to output a voltage higher than an input voltage for example. The charge pump circuit can raise voltage by changing the connection state of a plurality of capacitative elements with a switch or the like.

Here, although the capacitative element is formed over the principal face of the semiconductor substrate 1 through the gate insulation film 4 in order to increase a capacitative value in the present embodiment, the capacitative element may also be formed over the element isolation section STI. When the capacitative element is formed over the element isolation section STI, a parasitic capacitance comprising the semiconductor substrate 1 and the lower electrode 10E is negligibly small and hence it is possible to carry out the above operation stably. Further, even when the position of a contact hole reaching the upper electrode 11E and the position of a contact hole reaching the lower electrode 10E, those being formed in a succeeding process, are misaligned because of the misalignment of a photoresist pattern or the like, the positions are misaligned within the element isolation section STI and hence short circuit between a wire and the semiconductor substrate 1 through the contact holes is not caused.

Figure 11:
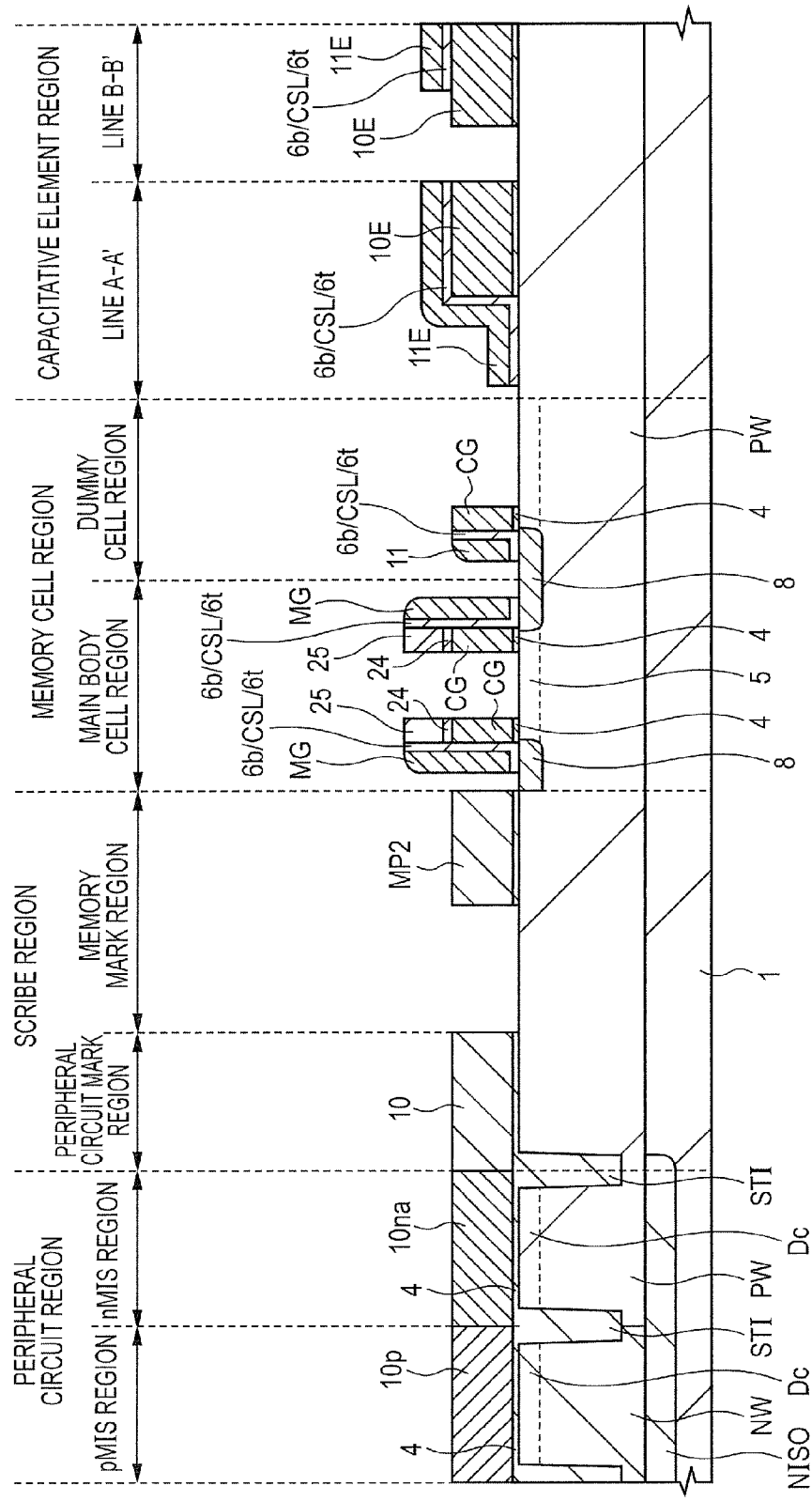
FIG. 11 is a sectional view of the substantial part identical to FIG. 1 in a manufacturing process succeeding to FIG. 10 of a semiconductor device having nonvolatile memory cells.

Successively, as shown in FIG. 11, an n-type conductive film 10na comprising the first conductive film is formed by introducing n-type impurities into the conductive film 10 in the nMIS region of the peripheral circuit region by ion-implantation method or the like. Further, a p-type conductive film 10p comprising the first conductive film is formed by introducing p-type impurities into the conductive film 10 in the pMIS region of the peripheral circuit region by ion-implantation method or the like.

Figure 12:
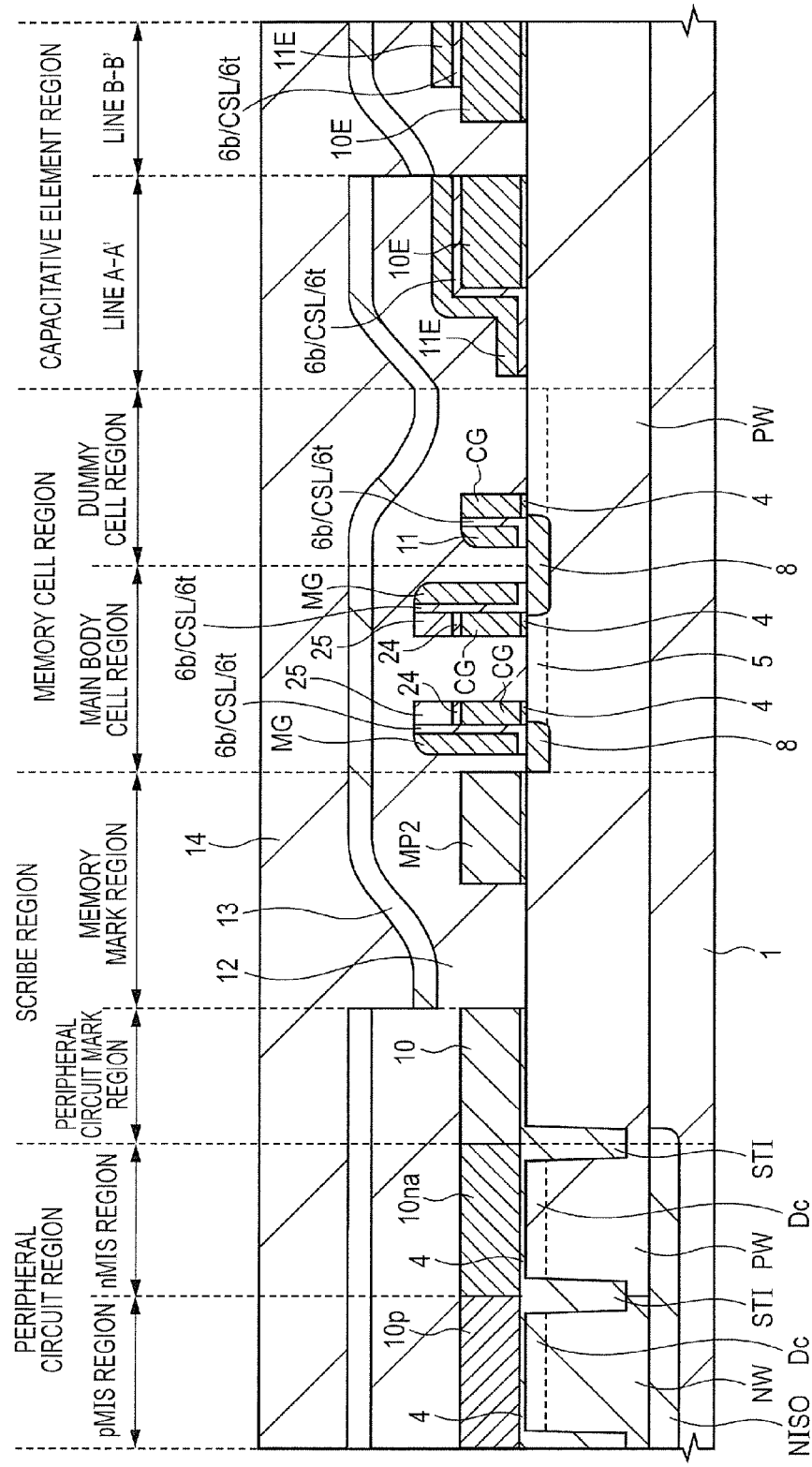
FIG. 12 is a sectional view of the substantial part identical to FIG. 1 in a manufacturing process succeeding to FIG. 11 of a semiconductor device having nonvolatile memory cells.

Successively, as shown in FIG. 12, a three-layered resist film comprising a lower layer resist film 12, a resist intermediate layer 13, and an upper layer resist film 14 is formed over the principal face of the semiconductor substrate 1. The lower layer resist film 12 is a resist for alleviating level difference and comprises an aromatic resin for example. Further, the resist intermediate layer 13 comprises an organic material or an inorganic material containing silicon and an organic silicon-containing material (an SOG film) formed by an SOG method or an inorganic silicon-containing material (a silicon oxide film, a silicon nitride film, a silicon oxynitride film, or the like) formed by a plasma CVD method is used for example. Further, the upper layer resist film 14 is a resist for photo-sensing and comprises a resin containing silicon for example. By using such a three-layered resist film, it is possible to reduce the reflection or scattering of light or an electron beam coming from the interior of the three-layered resist film or from the surface of the n-type conductive film 10$na$, the p-type conductive film 10$p$, or the conductive film 10 and improve a resolving, power.

In the meantime, in all the memory cells formed in a memory cell region studied by the present inventors in advance of the present invention, a silicon oxide film 24 and a silicon nitride film 25 are stacked over a selective gate electrode CG comprising an n-type conductive film 10$n$ (refer to FIGS. 28 to 32 stated earlier). Consequently, even in a dummy cell region on the outermost side of a memory mat in a second direction, a pattern comprised of a laminated film of the selective gate electrode CG, the silicon oxide film 24, and the silicon nitride film 25 is allocated. In the present embodiment however, although the selective gate electrode CG comprising the n-type conductive film 10$n$ is allocated in the dummy cell region on the outermost side of the memory mat in the second direction, the silicon oxide film 24 and the silicon nitride film 25 are not formed thereover. That is, in the dummy cell region on the outermost side of the memory mat in the second direction, a pattern comprised of only the selective gate electrode CG having a height from the principal face of the semiconductor substrate 1 about a half of the height of a pattern comprised of a related-art laminated film is allocated.

In the present embodiment therefore, the level difference of the lower layer resist film 12 with which the pattern comprised of the selective gate electrode CG located on the outermost side of the memory mat in the second direction is covered comes to be gentler than the level difference of a lower layer resist film 12 with which a related-art pattern comprised of a laminated film of a selective gate electrode CG, a silicon oxide film 24, and a silicon nitride film 25 located on the outermost side of the memory mat in the second direction is covered. In this way, it is possible to improve the uniformity of the thickness of the resist intermediate layer 13 formed over the lower layer resist film 12 and form the resist intermediate layer 13 having a desired thickness at an end of the memory mat in the memory cell region.

Further, a related-art memory mark pattern MP3 formed in a scribe region studied by the present inventors in advance of the present invention comprises a laminated film of a conductive film 10, a silicon oxide film 24, and a silicon nitride film 25 (refer to FIGS. 28 to 32 stated earlier). In the present embodiment however, the memory mark pattern MP2 comprises only the conductive film 10 and the height of the memory mark pattern MP2 from the principal face of the semiconductor substrate 1 is about a half of the height of a related-art memory mark pattern MP3 from the principal face of a semiconductor substrate 1.

Consequently, in the present embodiment, the level difference of the lower layer resist film 12 at an end of the memory mark pattern PM2 is gentler than the level difference of a lower layer resist film 12 at an end of a related-art memory mark pattern MP3. In this way, it is possible to improve the uniformity of the thickness of the resist intermediate layer 13 formed over the lower layer resist film 12 and form the resist intermediate layer 13 having a desired thickness at an end of the memory mark pattern MP2.

Figure 13:
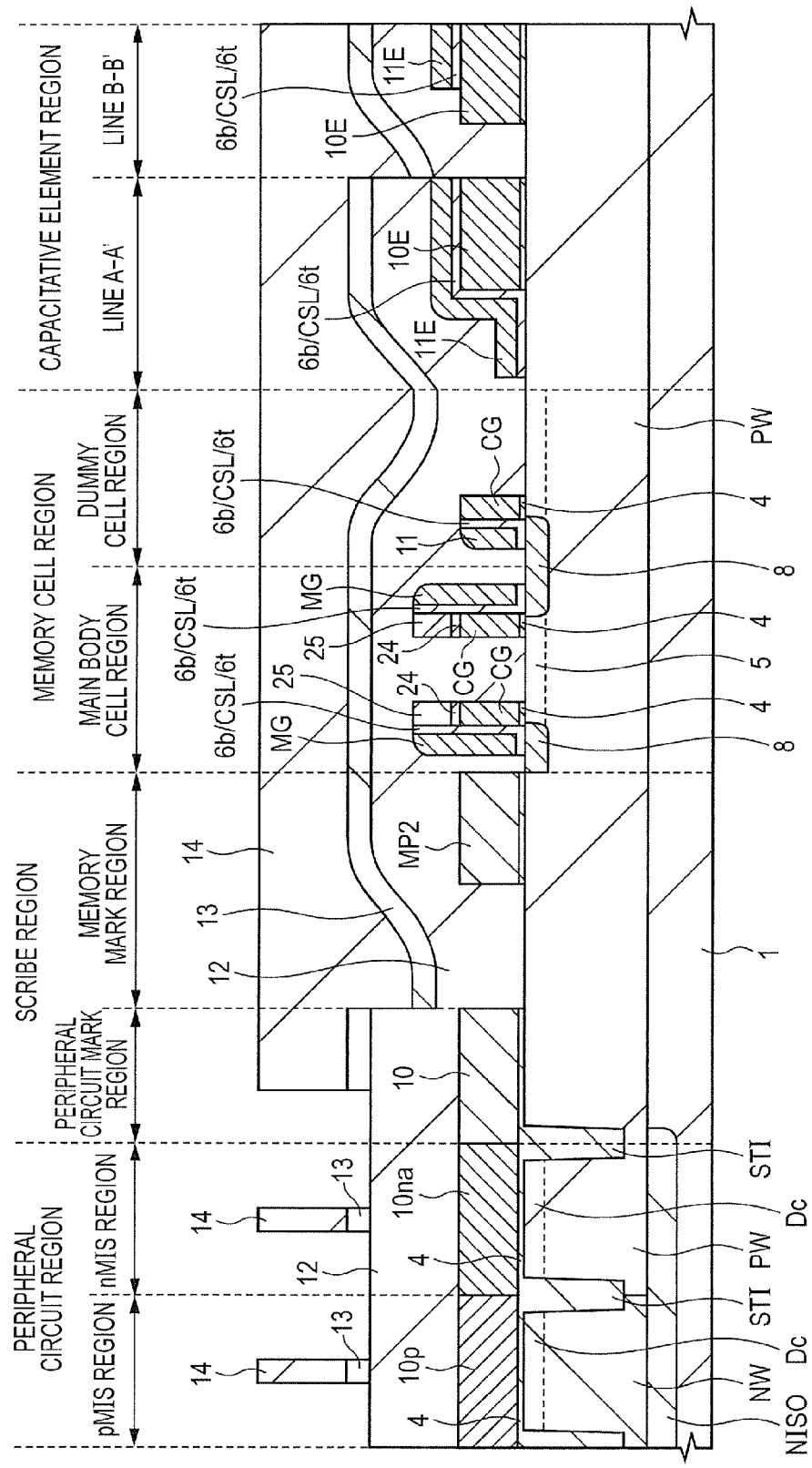
FIG. 13 is a sectional view of the substantial part identical to FIG. 1 in a manufacturing process succeeding to FIG. 12 of a semiconductor device having nonvolatile memory cells.

Successively, as shown in FIG. 13, after a pattern of the upper layer resist film 14 is formed by photolithography, a pattern of the resist intermediate layer 13 is formed by etching the resist intermediate layer 13 with the pattern of the upper layer resist film 14 as a mask.

Figure 14:
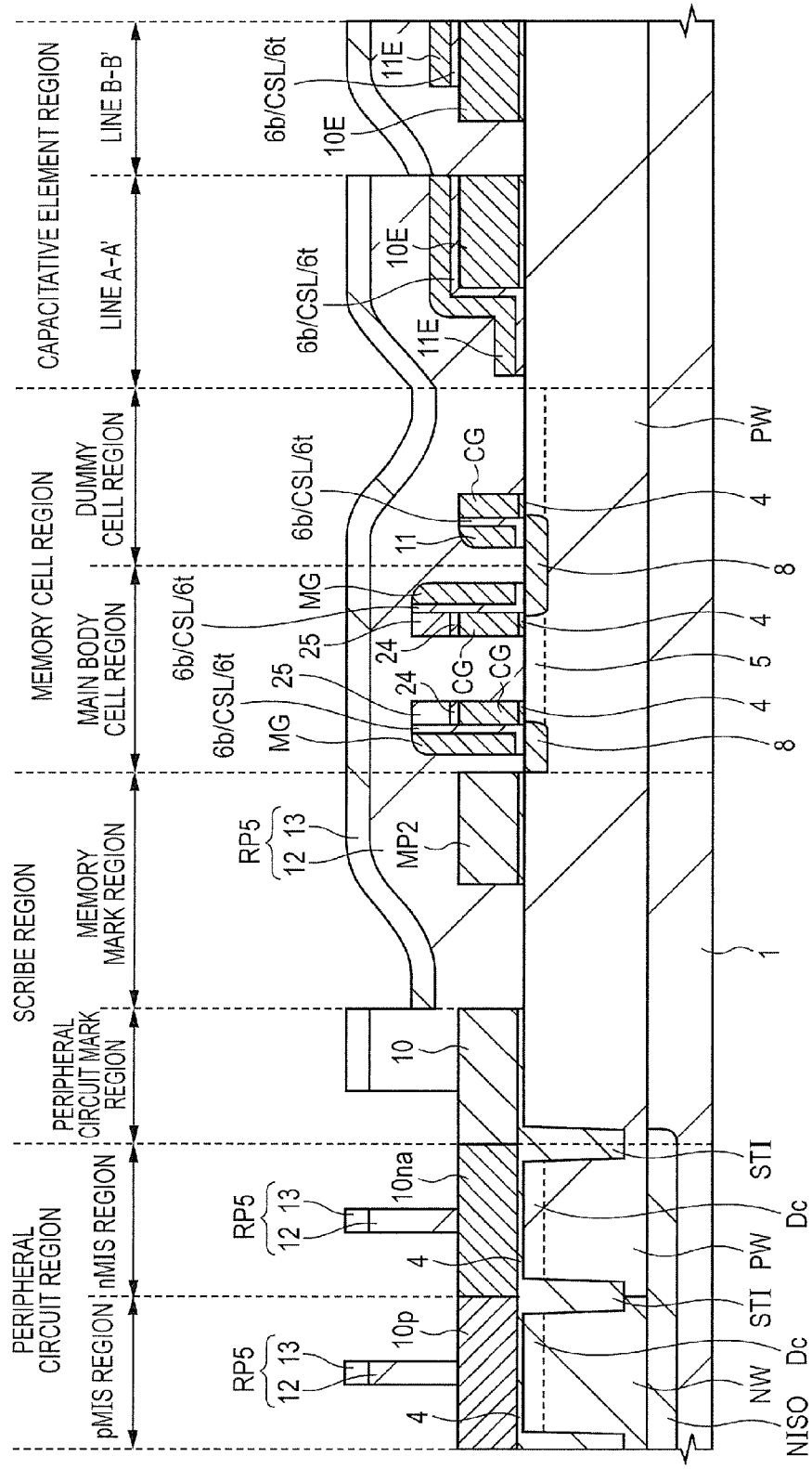
FIG. 14 is a sectional view of the substantial part identical to FIG. 1 in a manufacturing process succeeding to FIG. 13 of a semiconductor device having nonvolatile memory cells.

Successively, as shown in FIG. 14, a pattern of the lower layer resist film 12 is formed by etching the lower layer resist film 12 with the pattern of the upper layer resist film 14 and the resist intermediate layer 13 as a mask. On this occasion, the upper layer resist film 14 also disappears and a photoresist pattern RP5 comprising, the lower layer resist film 12 and the resist intermediate layer 13 is formed.

Figure 15:
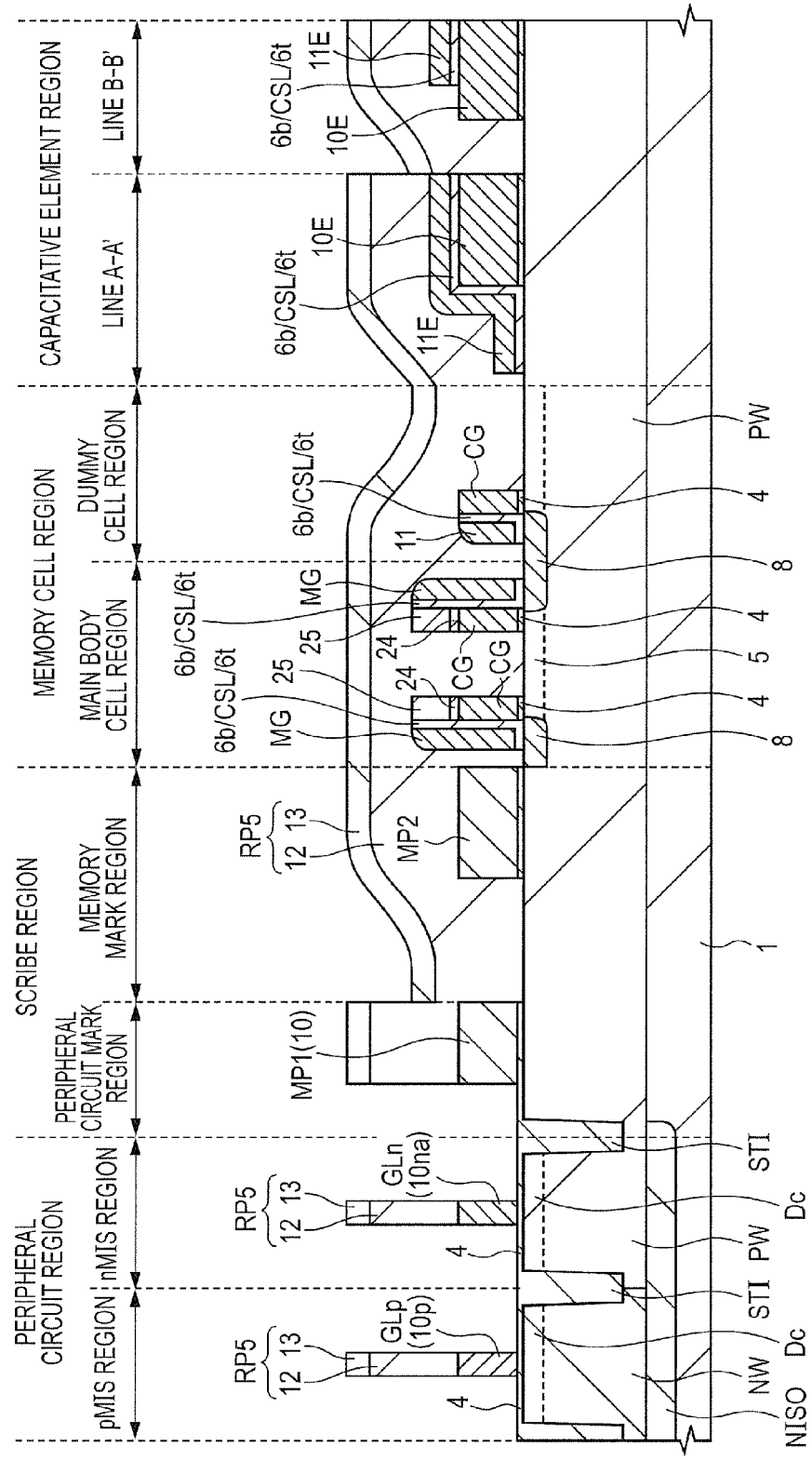
FIG. 15 is a sectional view of the substantial part identical to FIG. 1 in a manufacturing process succeeding to FIG. 14 of a semiconductor device having nonvolatile memory cells.

Successively, as shown in FIG. 15, a gate electrode GLn of a low voltage system nMIS comprising the n-type conductive film, 10$na$ and a gate electrode GLp of a low voltage system pMIS comprising the p-type conductive film 10$p$ are formed by dry-etching the n-type conductive film 10$na$ and the p-type conductive film 10$p$ respectively in the peripheral circuit region with the photoresist pattern RP5 as a mask. Each of the gate lengths of the gate electrode GLn of the low voltage system nMIS and the gate electrode GLp of the low voltage system pMIS in an active region is about 100 nm for example. Further, a peripheral circuit mark pattern MP1 (fifth pattern) comprising the conductive film 10 is formed in the peripheral circuit mark region (second region) of the scribe region. The peripheral circuit mark pattern MP1 is a register mark in a photolithography process for forming a photoresist pattern acting as a mask when impurities are ion-implanted into the semiconductor substrate 1 in the peripheral circuit region.

As stated earlier, in a related-art semiconductor device studied by the present inventors prior to the present invention (refer to FIGS. 28 to 32 stated earlier), a resist intermediate layer 13 reduces the thickness or disappears at an end of a memory mark pattern MP3 in a scribe region and at an end of a memory mat in a memory cell region and, furthermore, that causes processing defects of the memory mark pattern MP3 in the scribe region and a dummy memory cell located on the outermost side of the memory mat in a second direction in the memory cell region. In the present embodiment however, it is possible to inhibit the resist intermediate layer 13 from reducing the thickness or disappearing by gentling the level difference of the lower layer resist film 12. Consequently, it is possible to inhibit processing defects of the memory mark pattern MP2 in the scribe region and the dummy memory cell located on the outermost side of the memory mat in the second direction in the memory cell region.

FIG. 16 shows a schematic plan view in the present embodiment viewed, from above after forming the gate electrode GLn of the low-voltage system nMIS and the gate electrode GLp of the low-voltage system pMIS in the peripheral circuit region, the peripheral circuit mark pattern MP1 and the memory mark pattern MP2 in the scribe region, and the selective gate electrodes CG in the memory cell region (the main body cell region and the dummy cell regions).

In the memory cell region, a pattern (second pattern) comprised of the selective gate electrodes CG comprising the n-type conductive film 10$n$ is allocated in the dummy cell regions on the outermost sides of the memory mat in the second direction and neither silicon oxide film 24 nor silicon nitride film 25 is formed thereover. Further, in the main body cell region where the pattern (second pattern) comprised of the selective gate electrodes CG allocated on the outermost sides of the memory mat in the second direction is excluded, a pattern (first pattern) comprised of the laminated film of the selective gate electrodes CG comprising the n-type conductive film 10$n$, the silicon oxide film 24, and the silicon nitride film 25 is allocated. That is, there are two kinds of patterns (the pattern (first pattern) comprised of the laminated film of the selective gate electrodes CG, the silicon oxide film 24, and the silicon nitride film 25 and the other pattern (second pattern) comprised of the selective gate electrodes CG) having heights from the principal face of the semiconductor substrate 1 different from each other in the memory mat in the memory cell region.

Further, in the scribe region, the peripheral circuit mark pattern MP1 (fifth pattern) comprising the conductive film 10 and the memory mark pattern MP2 (fourth pattern) comprising the conductive film 10 are formed. Furthermore, in the peripheral circuit region, the gate electrode GLn of low-voltage system nMIS comprising the n-type conductive film 10na and the gate electrode GLp of the low voltage system pMIS comprising the p-type conductive film 10p are formed.

That is, the height of the peripheral circuit mark pattern MP1 (fifth pattern) formed in the scribe region from the principal face of the semiconductor substrate 1 is identical to the heights of the gate electrode GLn of the low-voltage system nMIS and the gate electrode GLp of the low-voltage system pMIS both formed in the peripheral circuit region from the principal face of the semiconductor substrate 1. On the other hand, the height of the memory mark pattern MP2 (fourth pattern) formed in the scribe region from the principal face of the semiconductor substrate 1: is identical to the height of the pattern (second pattern) comprised of the selective gate electrodes CG formed in the dummy cell regions on the outermost sides of the memory mat in the second direction from the principal face of the semiconductor substrate 1; but is different from the height of the pattern (first pattern) comprised of the laminated film of the selective gate electrodes CG, the silicon oxide film 24, and the silicon nitride film 25 formed in the main body cell region from the principal face of the semiconductor substrate 1.

FIG. 17 shows a schematic plan view of a related-art semiconductor device studied by the present inventors for comparison (refer to FIGS. 28 to 32 stated earlier) viewed from above after forming a gate electrode GLn of a low voltage system nMIS and a gate electrode GLp of a low voltage system pMIS in a peripheral circuit region, a peripheral circuit mark pattern MP1 and a memory mark pattern MP3 in a scribe region, and selective gate electrodes CG in a memory cell region (a main body cell region and dummy cell regions).

In the memory cell region, a pattern comprised of a laminated film of selective gate electrodes CG comprising an n-type conductive film 10n, a silicon oxide film 24, and a silicon nitride film 25 is allocated. That is, only the pattern having an identical height from the principal face of a semiconductor substrate 1 exists in both the dummy cell regions and the main body cell region in a memory mat in the memory cell region.

Here, in the scribe region, the peripheral circuit mark pattern MP1 comprising a conductive film 10 and the memory mark pattern MP3 comprising the conductive film 10, a silicon oxide film 24, and a silicon nitride filth 25 are formed. Furthermore, in the peripheral circuit region, the gate electrode GLn of the low voltage system nMIS comprising an n-type conductive film 10na and the gate electrode GLp of the low voltage system pMIS comprising a p-type conductive film 10p are formed.

That is, the height of the peripheral circuit mark pattern MP1 formed in the scribe region from the principal face of the semiconductor substrate 1 is identical to, the heights of the gate electrode GLn of the low voltage system nMIS and the gate electrode GLp of the low voltage system pMIS formed in the peripheral circuit region from the principal face of the semiconductor substrate 1. Meanwhile, the height of the memory mark pattern MP2 formed in the scribe region from the principal face of the semiconductor substrate 1: is different from the height of the peripheral circuit mark pattern MP1 formed in the scribe region from the principal face of the semiconductor substrate 1; but is identical to the height of the pattern comprised of the laminated film of the selective gate electrodes CG, the silicon oxide film 24, and the silicon nitride film 25 formed in the memory cell region from the principal face of the semiconductor substrate 1.

Figure 18:
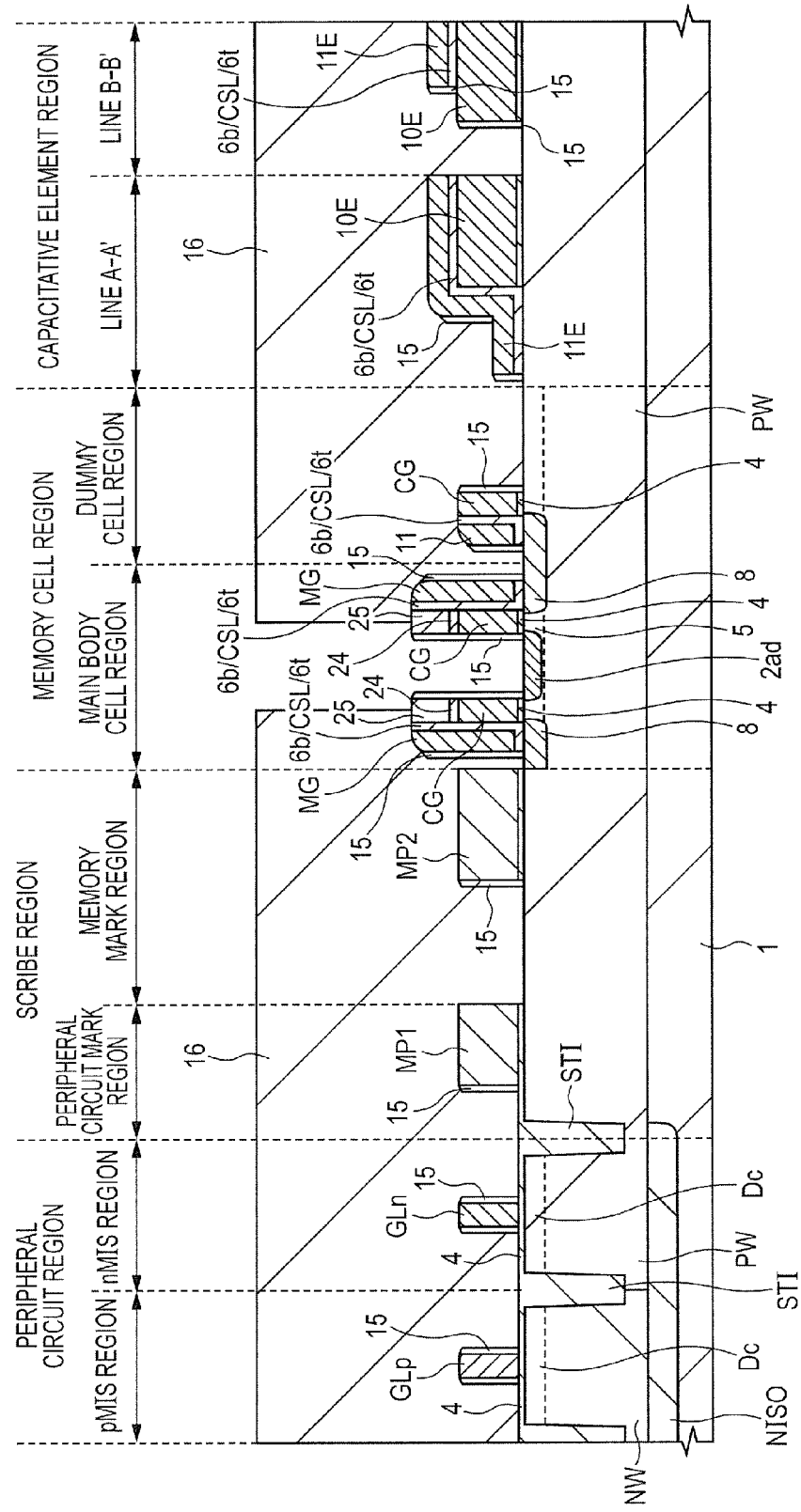
FIG. 18 is a sectional view of the substantial part identical to FIG. 1 in a manufacturing process succeeding to FIG. 15 of a semiconductor device having nonvolatile memory cells.

Successively, as shown in FIG. 18, after an insulation film about 10 nm in thickness comprising silicon oxide for example is deposited over the principal face of the semiconductor substrate 1 by a CVD method, the insulation film is processed by anisotropic dry etching. In this way, in the memory cell region, sidewalls 15 are formed over: side faces of the pattern comprised of the laminated film of the selective gate electrodes CG, the silicon oxide film 24, and the silicon nitride film 25 on the side where the memory gate electrodes MG are not formed; a side face of the pattern comprised of the selective gate electrode CG on the side where the memory gate electrode MG is not formed; and side faces of the memory gate electrodes MG. Further, in the capacitive element region, sidewalls 15 are formed over the side faces of the upper electrode 11E and, in the peripheral circuit region, sidewalls 15 are formed over both the side faces of the gate electrode GLn of the low voltage system nMIS and both the side faces of the gate electrode GLp of the low voltage system pMIS respectively. The spacer length of the sidewalls 15 is about 6 nm for example.

In this way, it is possible to cover, with the sidewalls 15, the exposed side faces of the gate insulation film 4 between the selective gate electrodes CG and the semiconductor substrate 1 and the exposed side faces of the insulation films 6b and 6t and the charge storage layer CSL between the memory gate electrodes MG and the semiconductor substrate 1. By forming the sidewalls 15, in the processes, which will be stated later, of forming an n⁻-type semiconductor region in the nMIS region and forming a p⁻-type semiconductor region in the pMIS region of the peripheral circuit region, effective channel lengths of the n-type semiconductor region and the p⁻-type semiconductor region increase and the short channel effect of the low voltage system nMIS and the low voltage system pMIS can be inhibited.

Successively, after a photoresist pattern 16, the ends of which are located over the top face of the pattern comprised of the laminated film of the selective gate electrodes CG, the silicon oxide film 24, and the silicon nitride film 25 in the memory cell region, covering parts of the selective gate electrodes CG on the sides of the memory gate electrodes MG and the memory gate electrodes MG is formed, by ion-implanting n-type impurities, for example arsenic, into the principal face of the semiconductor substrate 1 with the pattern comprised of the laminated film of the selective gate electrodes CG, the silicon oxide film 24, and the silicon nitride film 25, the memory gate electrodes MG, and the photoresist pattern 16 as a mask, an type semiconductor region 2ad is formed over the principal face of the semiconductor substrate 1 so as to be self-aligned to the selective gate electrodes CG. The memory mark pattern MP2 formed in the scribe region is used as a register mark when the photoresist pattern 16 is formed.

Figure 19:
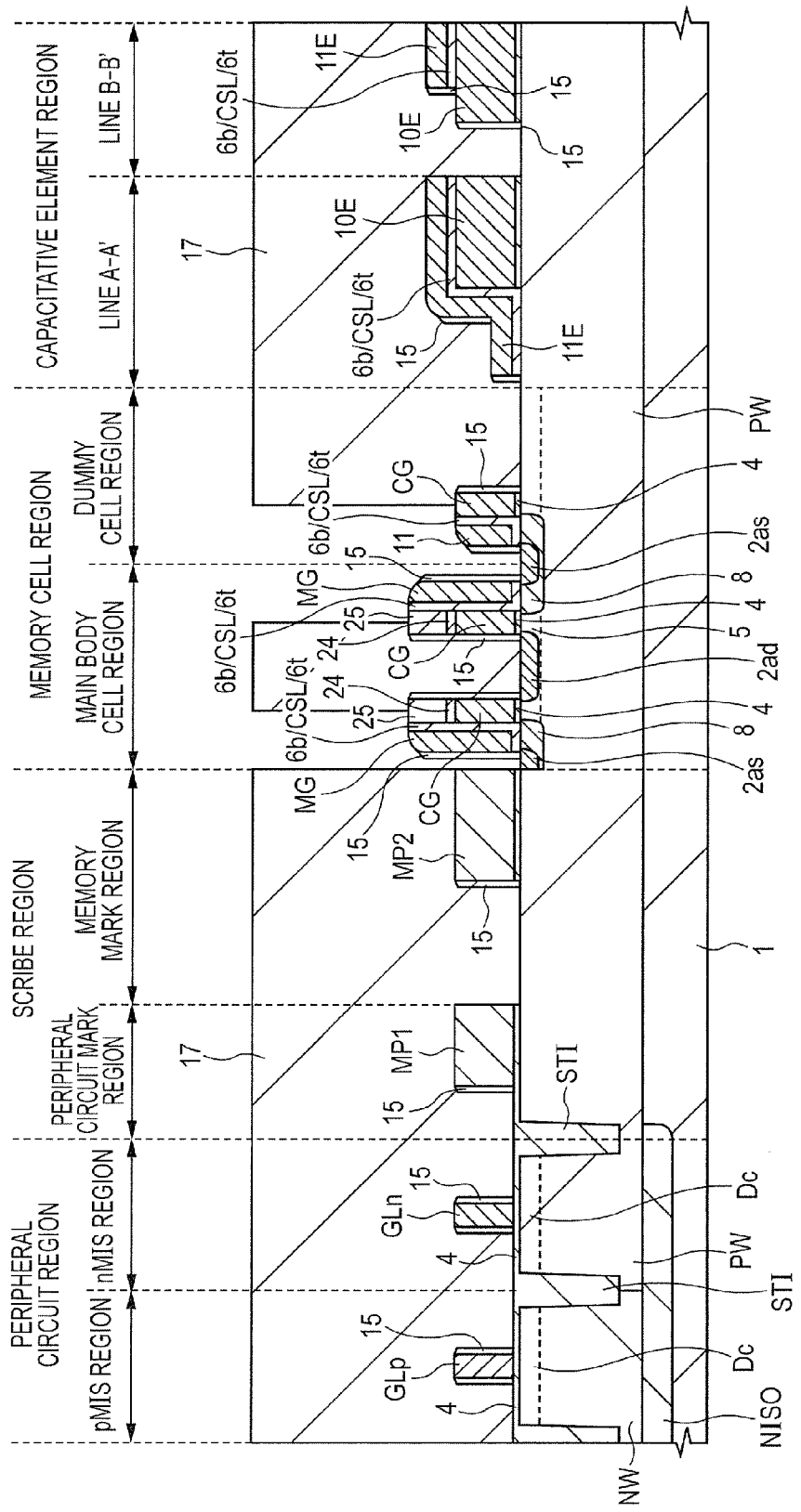
FIG. 19 is a sectional view of the substantial part identical to FIG. 1 in a manufacturing process succeeding to FIG. 18 of a semiconductor device having nonvolatile memory cells.

Successively, as shown in FIG. 19, after the photoresist pattern 16 is removed, a photoresist pattern 17, the ends of which are located over the top face of the pattern comprised of the laminated film of the selective gate electrodes CG, the silicon oxide film 24, and the silicon nitride film 25 in the memory cell region, covering parts of the selective gate electrodes CG on the opposite sides of the memory gate electrodes MG is formed. Successively, by ion-implanting n-type impurities, for example arsenic, into the principal face of the semiconductor substrate 1 with the pattern comprised of the laminated film of the selective gate electrodes. CG, the silicon oxide film 24, and the silicon nitride film 25, the memory gate electrodes MG, and the photoresist pattern 17 as a mask, $n^-$-type semiconductor regions 2 as are formed over the principal face of the semiconductor substrate 1 so as to be self-aligned to the memory gate electrodes MG. The memory mark pattern MP2 formed in the scribe region is used as a register mark when the photoresist pattern 17 is formed.

Although the $n^-$-type semiconductor region 2ad is formed in advance and the $n^-$-type semiconductor regions 2 as are formed thereafter in this case, the $n^-$-type semiconductor regions 2as may be formed in advance and the $n^-$-type semiconductor region 2ad may be formed thereafter. Further, in succession to the ion-implantation of $n^-$-type impurities to form the $n^-$-type semiconductor region 2ad, p-type impurities, for example boron, may be ion-implanted into the principal face of the semiconductor substrate 1 and a p-type semiconductor region may be formed so as to surround the lower part of the $n^-$-type semiconductor region 2ad.

Figure 20:
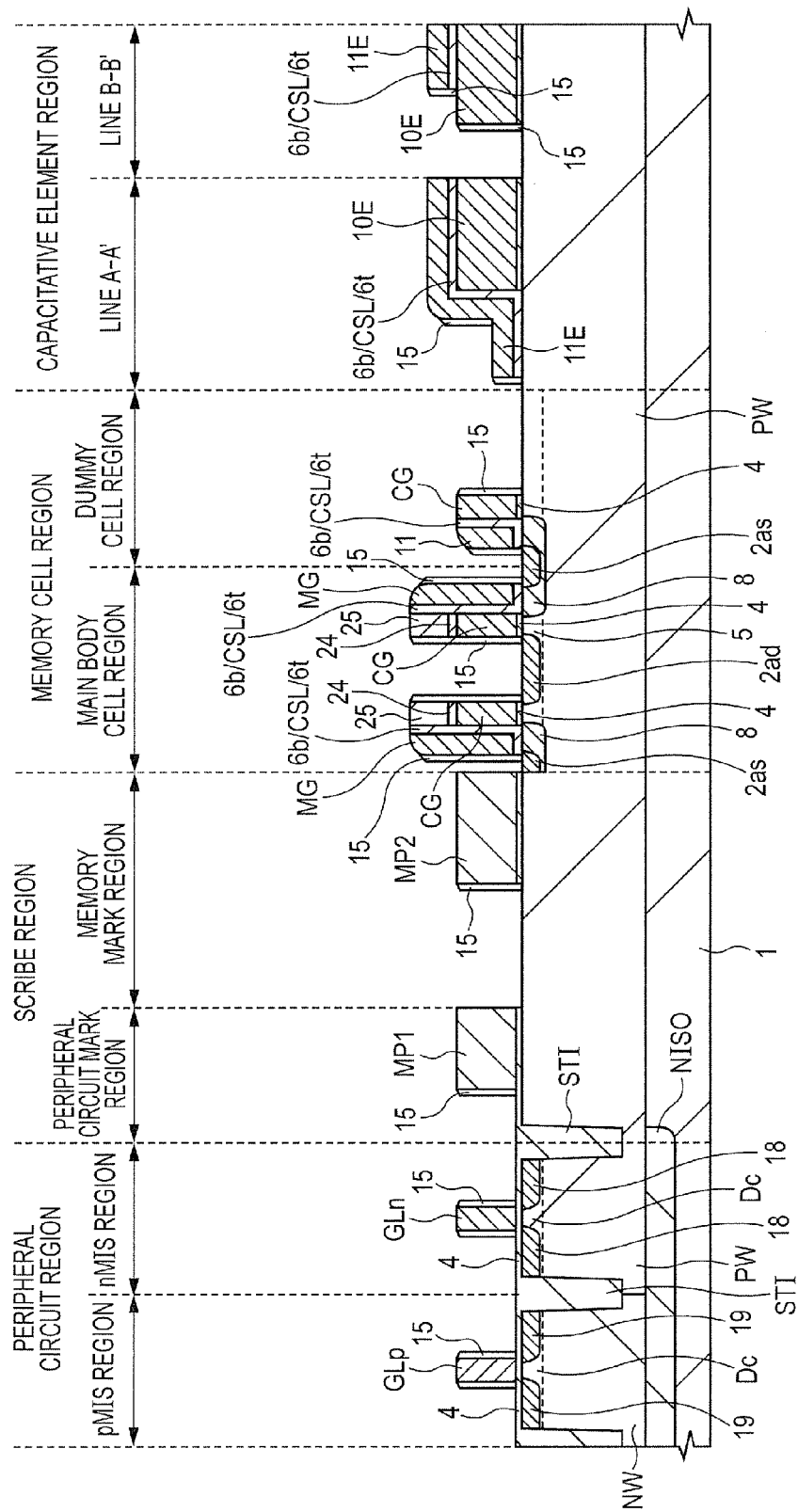
FIG. 20 is a sectional view of the substantial part identical to FIG. 1 in a manufacturing process succeeding to FIG. 19 of a semiconductor device having nonvolatile memory cells.

Successively, as shown in FIG. 20, by ion-implanting type impurities, for example arsenic, into the principal face of the semiconductor substrate 1 in the low voltage system nMIS region of the peripheral circuit region with a photoresist pattern as a mask, $n^-$-type semiconductor regions 18 are formed so as to be self-aligned to the gate electrode GLn over the principal face of the semiconductor substrate 1 in the low voltage system nMIS region of the peripheral circuit region. The peripheral circuit mark pattern MP1 formed in the scribe region is used as a register mark when the photoresist pattern, is formed.

Likewise, by ion-implanting p-type impurities, for example boron fluoride, into the principal face of the semiconductor substrate 1 in the low voltage system pMIS region of the peripheral circuit region with a photoresist pattern as a mask, $p^-$-type semiconductor regions 19 are formed so as to be self-aligned to the gate electrode GLp over the principal face of the semiconductor substrate 1 in the low voltage system pMIS region of the peripheral circuit region. The peripheral circuit mark pattern MP1 formed in the scribe region is used as a register mark when the photoresist pattern is formed.

Figure 21:
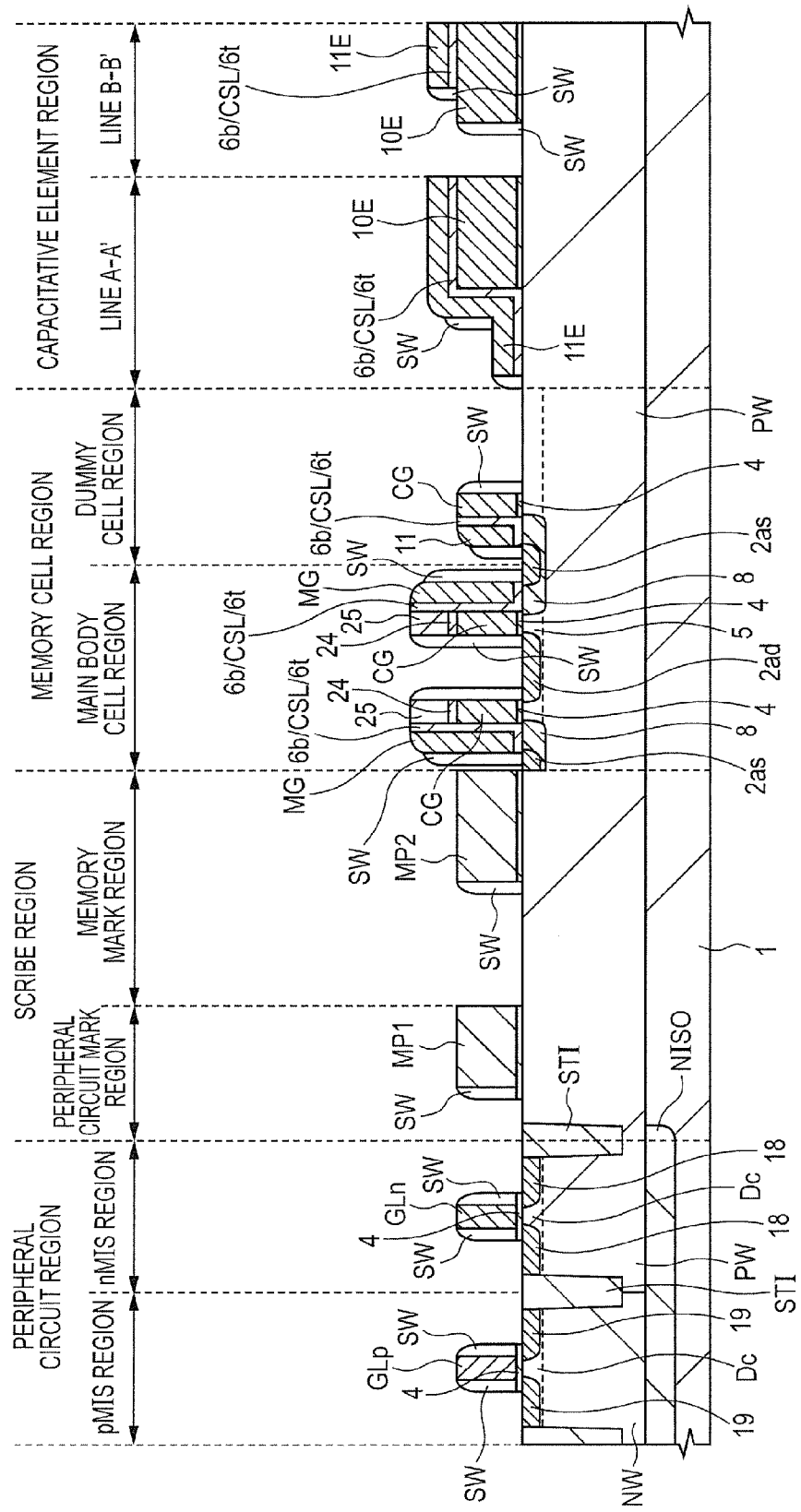
FIG. 21 is a sectional view of the substantial part identical to FIG. 1 in a manufacturing process succeeding to FIG. 20 of a semiconductor device having nonvolatile memory cells.

Successively, as shown in FIG. 21, over the principal face of the semiconductor substrate 1, for example a lower layer silicon oxide film, a silicon nitride film, and an upper layer silicon oxide film are deposited in sequence by a CVD method and etched back by anisotropic dry etching. The thickness of the lower layer silicon oxide film is about 20 nm for example, the thickness of the silicon nitride film is about 25 nm for example, and the thickness of the upper layer silicon oxide film is about 50 nm for example.

In this way, in the memory cell region, sidewalls SW are formed over: side faces of the pattern comprised of the laminated film of the selective gate electrodes CG, the silicon oxide film 24, and the silicon nitride film 25 on the sides where the memory gate electrodes MG are not formed; a side face of the pattern comprised of the selective gate electrode CG on the side where the memory gate electrode MG is not formed; and side faces of the memory gate electrodes MG. Further, in the capacitative element region, sidewalls SW are formed over the side faces of the upper electrode 11E and, in the peripheral circuit region, sidewalls SW are formed over both the side faces of the gate electrode GLn of the low voltage system nMIS and also over both the side faces of the gate electrode GLp of the low voltage system pMIS respectively.

Figure 22:
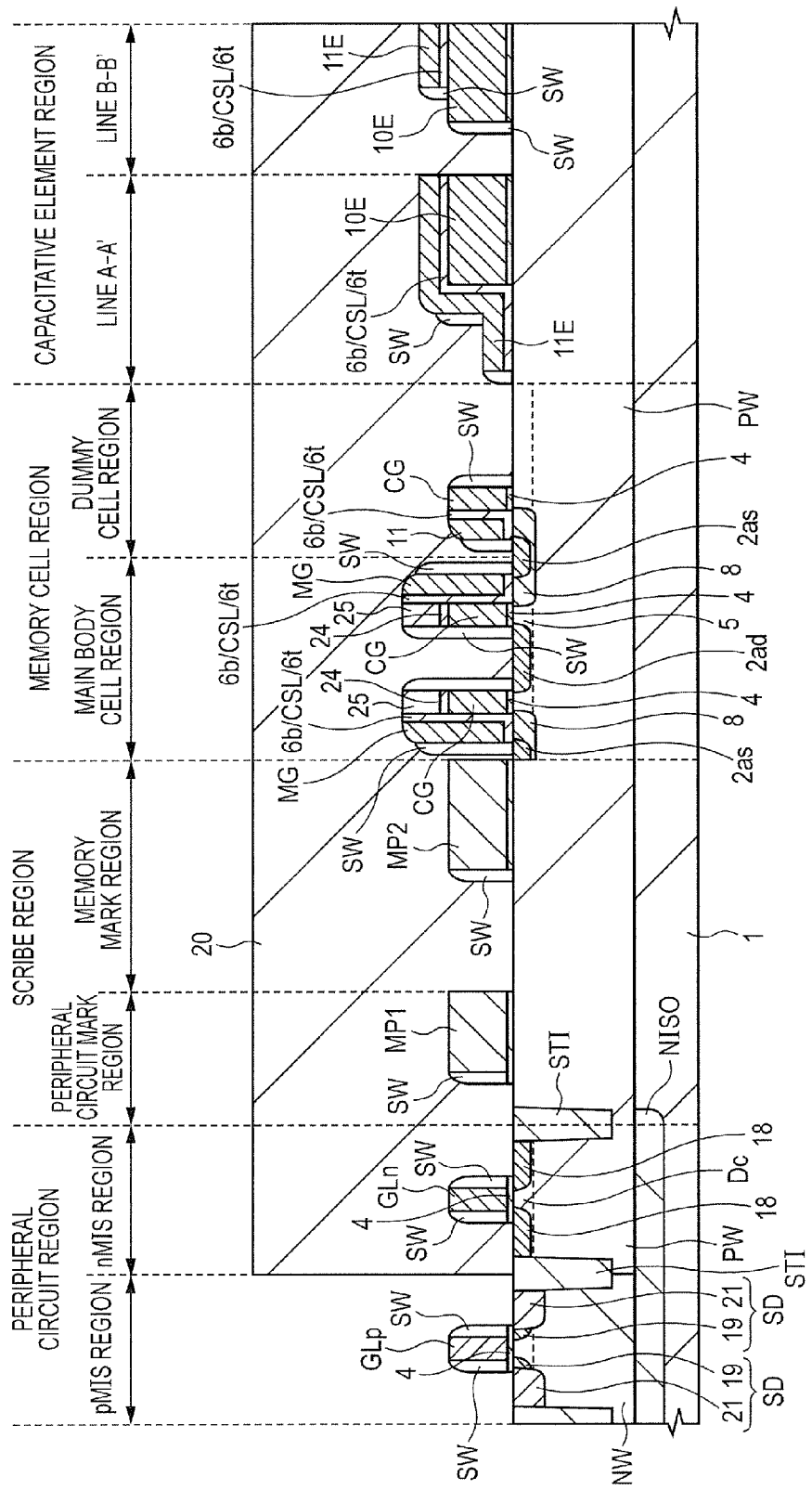
FIG. 22 is a sectional view of the substantial part identical to FIG. 1 in a manufacturing process succeeding to FIG. 21 of a semiconductor device having nonvolatile memory cells.

Successively, as shown in FIG. 22, over the principal face of the semiconductor substrate 1 in the low voltage system pMIS region of the peripheral circuit region, by ion-implanting p-type impurities, for example boron or boron fluoride, into the principal face of the semiconductor substrate 1 with a photoresist pattern 20 as a mask, $p^+$-type semiconductor regions 21 are formed so as to be self-aligned to the gate electrode GLp of the low voltage system pMIS. In this way, source/drain regions SD of the low voltage system pMIS comprising the $p^-$-type semiconductor regions 19 and the $p^+$-type semiconductor regions 21 are formed. The peripheral circuit mark pattern MP1 formed in the scribe region is used as a register mark when the photoresist pattern 20 is formed.

Figure 23:
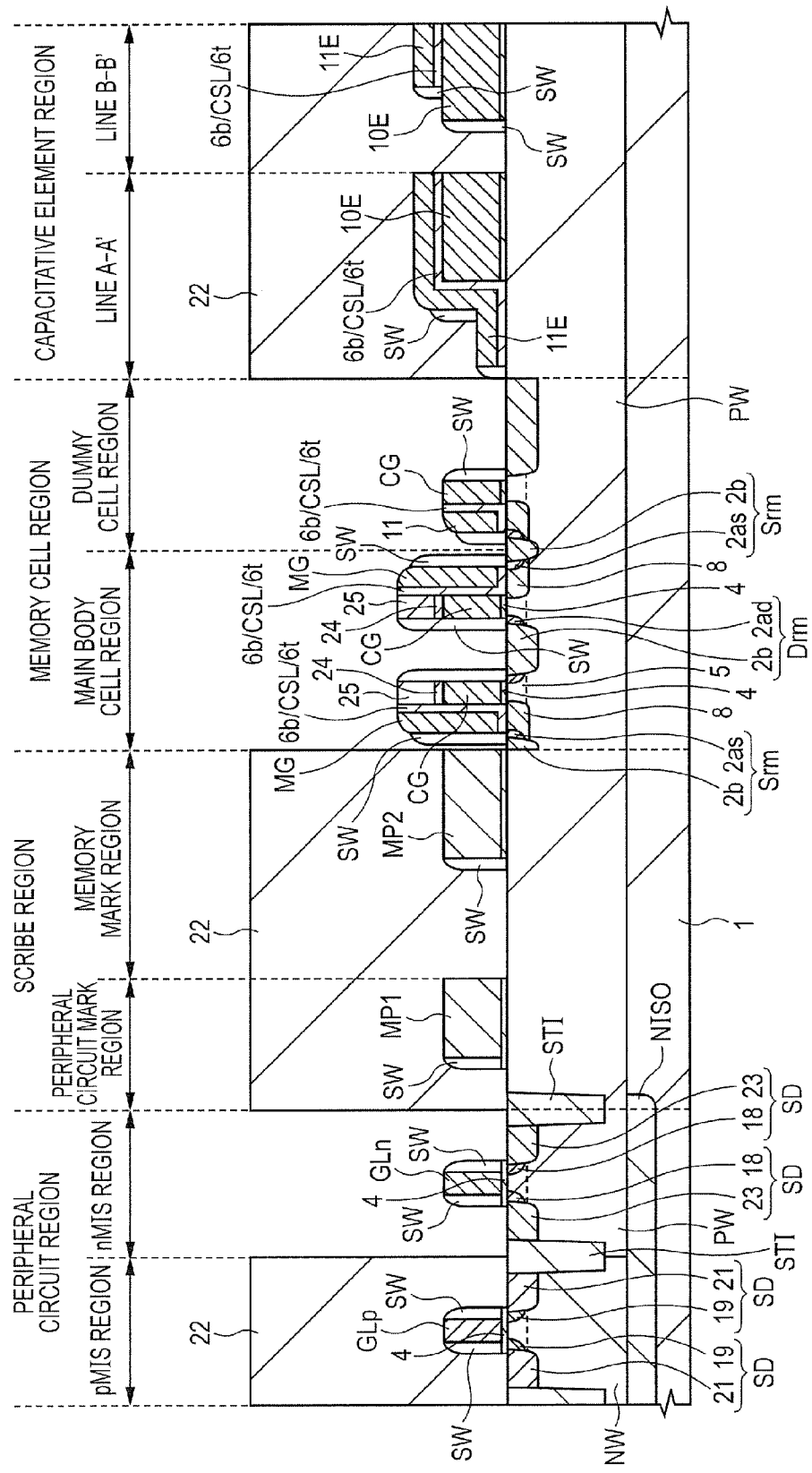
FIG. 23 is a sectional view of the substantial part identical to FIG. 1 in a manufacturing process succeeding to FIG. 22 of a semiconductor device having nonvolatile memory cells.

Successively, as shown in FIG. 23, after the photoresist pattern 20 is removed, over the principal face of the semiconductor substrate 1 in the memory cell region and the low voltage system nMIS region of the peripheral circuit region, by ion-implanting n-type impurities, for example arsenic and phosphorous, into the principal face of the semiconductor substrate 1 with a photoresist pattern 22 as a mask, $n^+$-type semiconductor regions 2b are formed so as to be self-aligned to the selective gate electrodes CG and the memory gate electrodes MG in the memory cell region and $n^+$-type semiconductor regions 23 are formed so as to be self-aligned to the gate electrode GLn of the low voltage system nMIS in the peripheral circuit region. The peripheral circuit mark pattern MP1 or the memory mark pattern MP2 formed in the scribe region is used as a register mark when the photoresist pattern 22 is formed.

In this way, a drain region Drm comprising the $n^-$-type semiconductor region 2ad and the $n^+$-type semiconductor region 2b and source regions Srm comprising the $n^-$-type semiconductor regions 2 as and the $n^+$-type semiconductor regions 2b are formed in the memory cell region. Further, source/drain regions SD of the low voltage system nMIS comprising the $n^-$-type semiconductor regions 18 and the $n^+$-type semiconductor regions 23 are formed in the peripheral circuit region.

Figure 24:
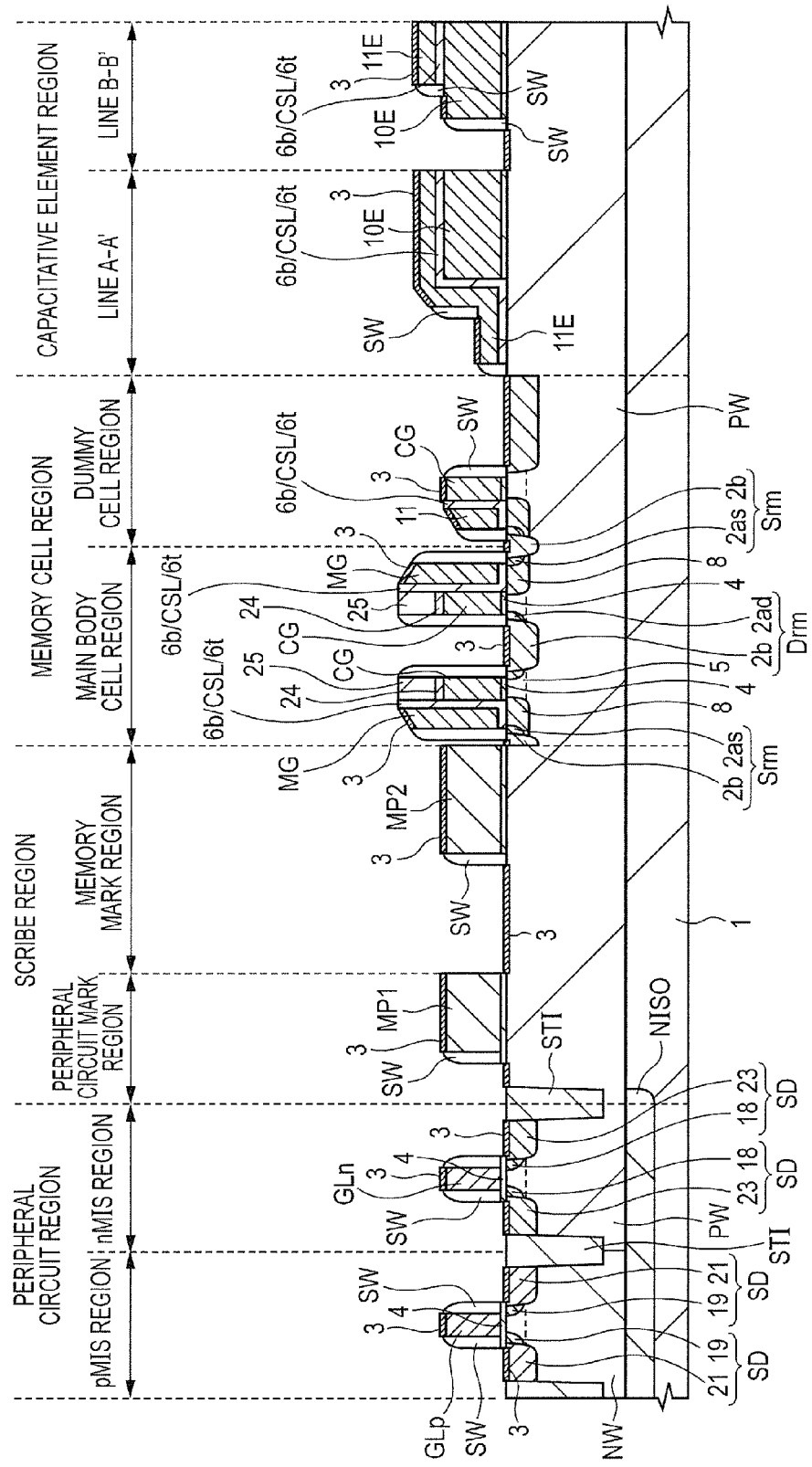
FIG. 24 is a sectional view of the substantial part identical to FIG. 1 in a manufacturing process succeeding to FIG. 23 of a semiconductor device having nonvolatile memory cells.

Successively, as shown in FIG. 24, after the photoresist pattern 22 is removed, in the memory cell region, a silicide layer 3 is formed over the top faces of the memory gate electrodes MG, the top face of the selective gate electrode CG located on the outermost side of the memory mat in the second direction, and the top faces of the $n^+$-type semiconductor regions 2b through a Salicide (Self Align silicide) process. As the silicide layer 3, nickel silicide or cobalt silicide is used for example.

Further, in the peripheral circuit region, the silicide layer 3 is formed over the top face of the gate electrode GLn and the top faces of the $n^+$-type semiconductor regions 23 of the low voltage system nMIS and over the top face of the gate electrode GLp and the top faces of the $p^+$-type semiconductor regions 21 of the low voltage system pMIS. In the capacitative element region, the silicide layer 3 is formed over the top faces of the parts of the upper electrode 11E not planarly overlapping with the sidewalls SW, and others. Furthermore, in the scribe region, the silicide layer 3 is formed over the top face of the peripheral circuit mark pattern MP1, the top face of the memory mark pattern MP2, and others.

By forming the silicide layer 3, it is possible to reduce connection resistance between the silicide layer 3 and a plug formed thereover or the like. In the memory cell region further, it is possible to reduce the resistance of the memory gate electrodes MG, the source regions Srm, and the drain region Drm themselves. Moreover, in the peripheral circuit region, it is possible to reduce the resistance of the gate electrode GLn of the low voltage system nMIS, the gate electrode GLp of the low voltage system pMIS, and the source/drain regions SD themselves.

Through the above processes, the memory cells and the dummy memory cell formed in the memory cell region, the low voltage system nMIS and the low voltage system pMIS formed in the peripheral circuit region, and the capacitative element according to the present embodiment are almost completed.

Figure 25:
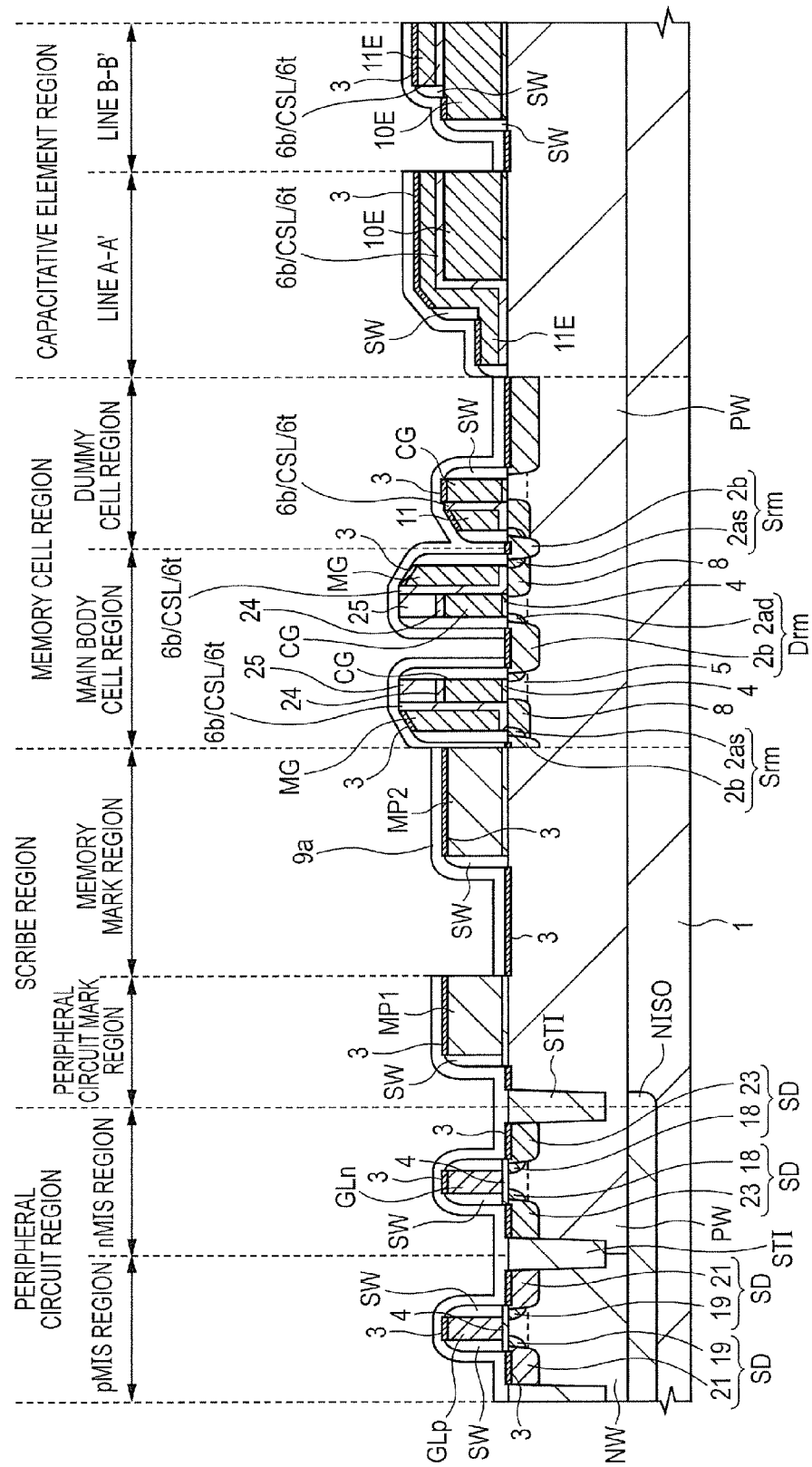
FIG. 25 is a sectional view of the substantial part identical to FIG. 1 in a manufacturing process succeeding to FIG. 24 of a semiconductor device having nonvolatile memory cells.

Successively, as shown in FIG. 25, a silicon nitride film 9a is deposited over the principal face of the semiconductor substrate 1 as an insulation film by a CVD method. The silicon nitride film 9a functions as an etching stopper when contact holes that will be stated later are formed.

Figure 26:
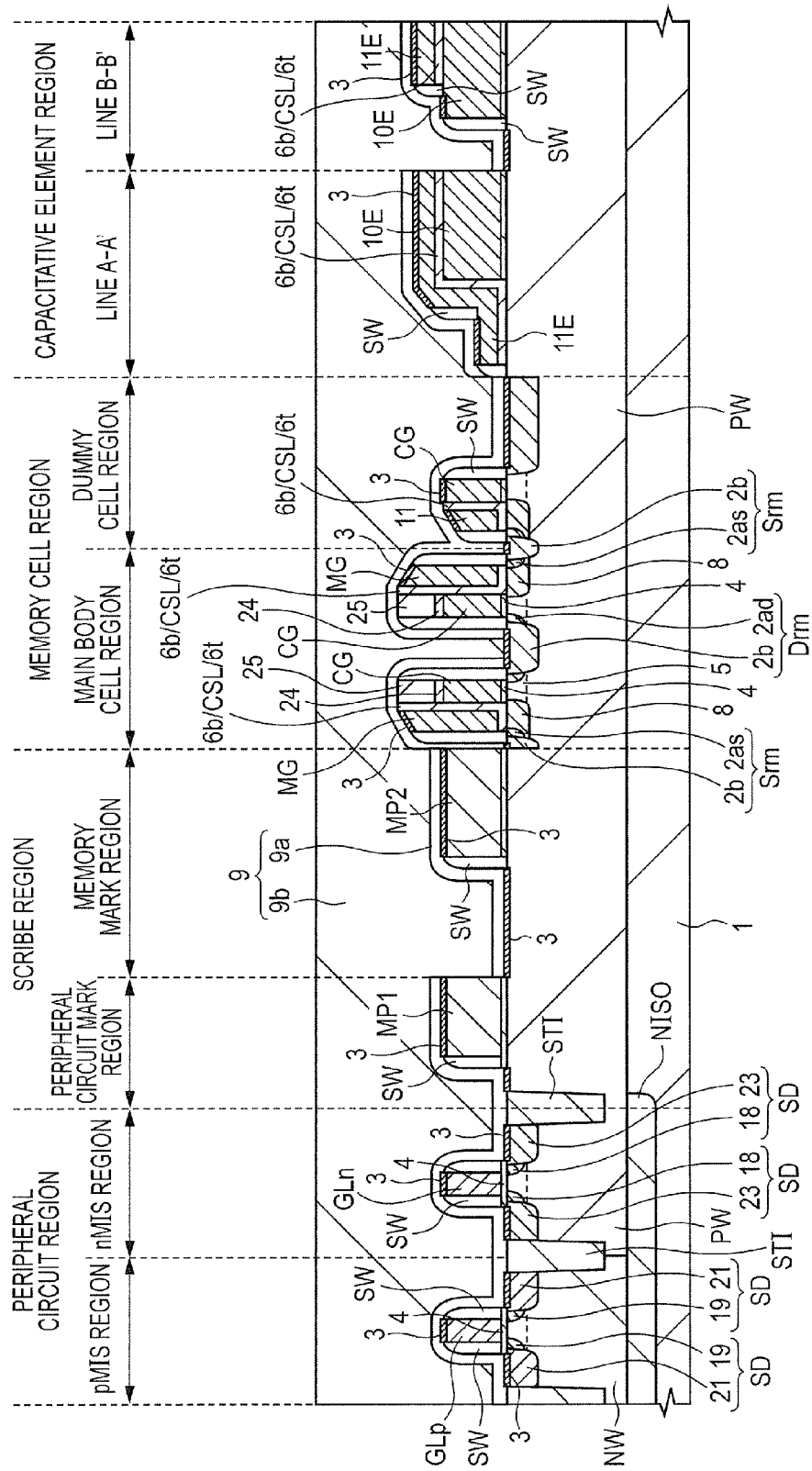
FIG. 26 is a sectional view of the substantial part identical to FIG. 1 in a manufacturing process succeeding to FIG. 25 of a semiconductor device having nonvolatile memory cells.

Successively, as shown in FIG. 26, a silicon oxide film 9b is deposited over the silicon nitride film 9a as an insulation film. The silicon oxide film 9b is for example a TEOS (Tetra Ethyl Ortho Silicate; $Si(OC_2H_5)_4$) oxide film deposited by a plasma CVD method using TEOS and ozone ($O_3$) as source gases. Successively, an interlayer insulation film 9 comprising the silicon nitride film 9a and the silicon oxide film 9b is formed by polishing the silicon oxide film 9b by a CMP method.

Figure 27:
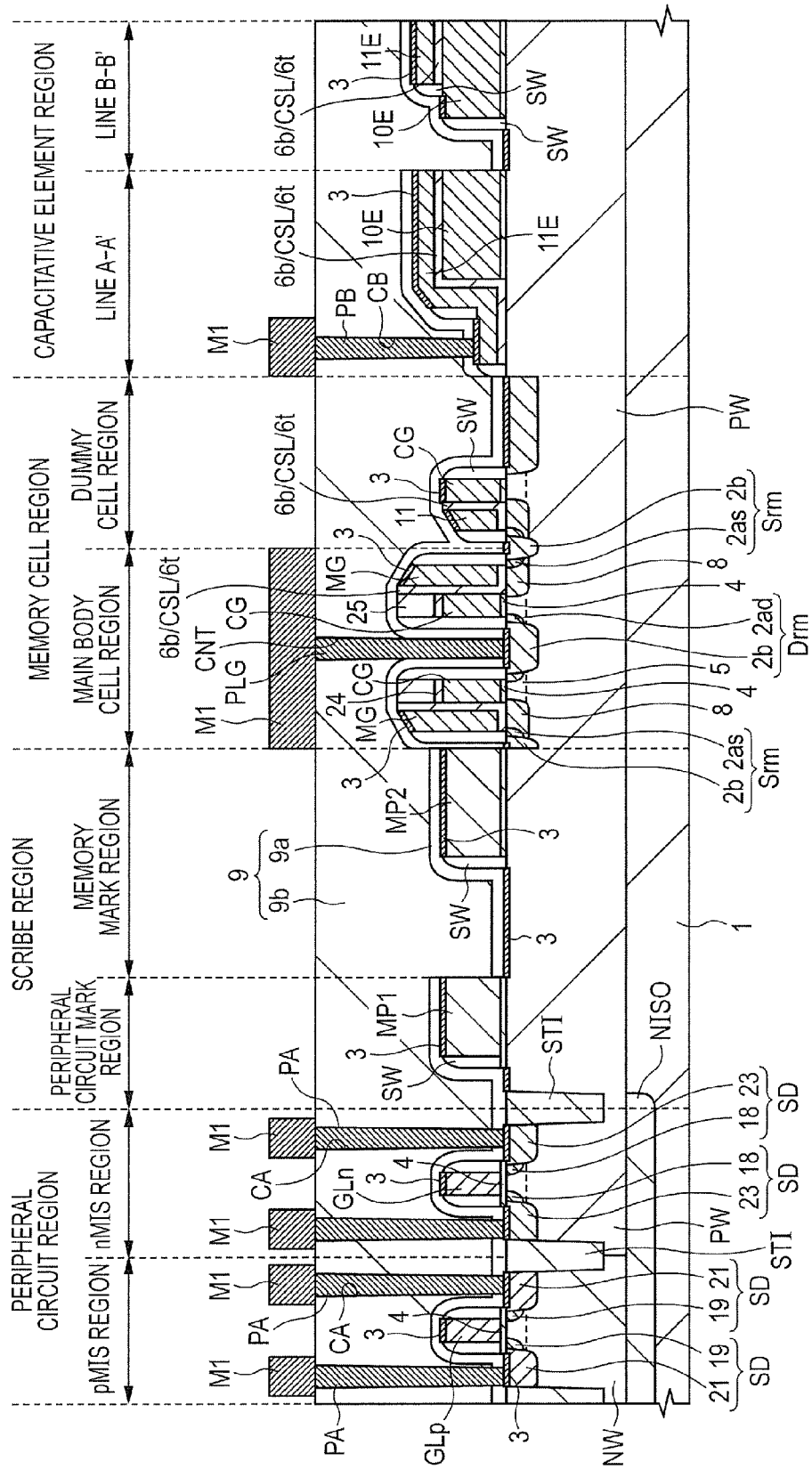
FIG. 27 is a sectional view of the substantial part identical to FIG. 1 in a manufacturing process succeeding to FIG. 26 of a semiconductor device having nonvolatile memory cells.

Successively, as shown in FIG. 27, in the memory cell region, a contact hole CNT reaching the silicide layer 3 over the drain region Drm is formed in the interlayer insulation film 9. Further, in the peripheral circuit region, contact holes CA reaching the silicide layer 3 over the gate electrode GLn and the source/drain regions SD of the low voltage system nMIS and the silicide layer 3 over the gate electrode GLp and the source/drain regions SD of the low voltage system pMIS are formed. Furthermore, in the capacitative region, contact holes CB reaching the silicide layer 3 over the upper electrode 11E and the lower electrode 10E are formed respectively at locations where the upper electrode 11E and the lower electrode 10E do not planarly overlap with each other. In FIG. 27, only the contact hole CB reaching the upper electrode 11E is shown in order to simplify the explanation.

Successively, a plug PLG is formed in the contact hole CNT, plugs PA are formed in the contact holes CA, and a plug PB is formed in the contact hole CB respectively. The plugs PLG, PA, and PB comprise a laminated film comprising a relatively thin barrier film comprising a laminated film of titanium and titanium nitride and a relatively thick conductive film comprising tungsten, aluminum, or the like formed so as to be wrapped with the barrier film, for example. Successively, a first layer wire M1 containing copper or aluminum as the main component for example is formed over the interlayer insulation film 9.

After that, a semiconductor device having nonvolatile memories is manufactured through ordinary manufacturing processes of a semiconductor device.

In this way, in the present embodiment, by not forming a steep level difference to a lower layer resist film 12 in a three-layered resist film comprising the lower layer resist film 12, a resist intermediate layer 13, and an upper layer resist film 14, it is possible to inhibit the resist intermediate layer 13 from reducing the thickness at a site where a steep level difference is formed in the lower layer resist film 12. As a result, it is possible to inhibit a film covered with the three-layered resist film from being etched because of disappearance of the resist intermediate layer 13 when the three-layered resist film is patterned. Consequently, it is possible to improve the production yield of a semiconductor device having non-volatile memory cells of a split gate structure.

Although the invention established by the present inventors has heretofore been explained specifically on the basis of the embodiment, it is needless to say that the present invention is not limited to the embodiment and can be variously modified in the range not deviating from the tenor of the present invention.

The present invention can be used for a semiconductor device having a memory mat where a plurality of memory cells, in particular memory cells of a sprit gate structure having a two-transistor configuration, are allayed.

What is claimed is:

1. A manufacturing method of a semiconductor device having a memory cell region having a memory mat where a plurality of memory cells are formed, a peripheral circuit region, and a scribe region, comprising the steps of:
    (a) forming a first gate insulation film over a principal face of a semiconductor substrate in said memory cell region;
    (b) forming a first conductive film and an insulation film in sequence over said first gate insulation film in said memory cell region;
    (c) forming a plurality of first patterns comprised of a laminated film of a selective gate electrode comprising said first conductive film and said insulation film in a first direction in said memory cell region by processing said insulation film and said first conductive film in sequence;
    (d) after said step (c), removing said insulation film configuring the upper part of said first pattern located on the outermost side of said memory mat in a second direction perpendicular to said first direction and forming a second pattern comprised of said selective gate electrode on the outermost side of said memory mat in said second direction;
    (e) after said step (d), forming a second gate insulation film with which said first patterns and said second pattern in said memory cell region are covered over the principal face of said semiconductor substrate;
    (f) forming a second conductive film over said second gate insulation film;
    (g) leaving said second conductive film over both the side faces of each of said first patterns and both the side faces of said second pattern by applying anisotropic etching to said second conductive film; and
    (h) removing a part of said second conductive film and forming memory gate electrodes comprising said second conductive film over one side faces of said first patterns and one side face of said second pattern.

2. A manufacturing method of a semiconductor device according to claim 1, wherein said first patterns and said second pattern, the heights of which from the principal face of said semiconductor substrate are different from each other, exist in said memory cell region.

3. A manufacturing method of a semiconductor device according to claim 1, wherein said insulation film is a laminated film having a silicon oxide film as the lower layer and a silicon nitride film as the upper layer.

4. A manufacturing method of a semiconductor device according to claim 1,
    wherein, in said step (b), said first conductive film and said insulation film are formed in sequence in a first region of said scribe region,
    wherein, in said step (c), a third pattern comprised of a laminated film of said first conductive film and said insulation film in said first region of said scribe region is formed by sequentially processing said insulation film and said first conductive film in said first region of said scribe region, and
    wherein, in said step (d), said insulation film configuring the upper part of said third pattern is removed and a fourth pattern comprised of said first conductive film and used as a register mark in photolithography when said plural memory cells are formed is formed.

5. A manufacturing method of a semiconductor device according to claim 4, wherein the height of said second pattern from the principal face of said semiconductor substrate is identical to the height of said fourth pattern from the principal face of said semiconductor substrate.

6. A manufacturing method of a semiconductor device according to claim 4,
wherein, in said step (b), said first conductive film and said insulation film are formed in sequence in said peripheral circuit region and said second region of said scribe region,
wherein, in said step (d), said insulation film in said peripheral circuit region and said second region of said scribe region is removed, and
wherein, after said step (h), said first conductive film in said peripheral circuit region and said second region of said scribe region is processed respectively, a gate electrode of a field-effect transistor is formed in said peripheral circuit region, and a fifth pattern used as a register mark in photolithography when said field-effect transistor is formed is formed in said second region of said scribe region.

7. A manufacturing method of a semiconductor device according to claim 6, wherein the height of said fourth pattern from the principal face of said semiconductor substrate is identical to the height of said fifth pattern from the principal face of said semiconductor substrate.

8. A manufacturing method of a semiconductor device according to claim 1, further comprising the steps of:
(i), after said step (h), forming source regions and drain regions of said memory cells over said semiconductor substrate in said memory cell region; and
(j), after said step (i), forming a silicide layer over the top faces of said memory gate electrodes, over the top faces of said source regions, and over the top faces of said drain regions in said memory cell region.

9. A manufacturing method of a semiconductor device according to claim 1, wherein said memory cell formed on the outermost side of said memory mat in said second direction is a dummy memory cell.

10. A manufacturing method of a semiconductor device according to claim 1, wherein the second gate insulation film is a multilayer film comprising a charge accumulation layer of silicon nitride arranged between layers of silicon oxide.

11. A manufacturing method of a semiconductor device having a memory cell region including a main body cell region where a plurality of memory cells are formed and a dummy cell region, the manufacturing method comprising:
(a) forming a first gate insulation film over a face of a semiconductor substrate in the memory cell region;
(b) forming a first conductive film over the first gate insulation film in the memory cell region;
(c) forming a first insulation layer over the first conductive film in the memory cell region;
(d) forming a plurality of first patterns in the memory cell region, each first pattern being a laminated structure comprising a portion of the first conductive film and a corresponding portion of the first insulation layer over said portion of the first conductive film;
(e) modifying one of the first patterns in the dummy cell region to form a second pattern by removing the corresponding portion of the first insulation layer from said one of the first patterns, another of the first patterns in the main body cell region retaining its corresponding portion of the first insulation layer;
(f) forming a second gate insulation layer that covers the first and second patterns in the memory cell region;
(g) forming second conductive film sidewall portions over the second gate insulation layer in the memory cell region, portions of the second gate insulation layer being arranged between the second conductive film sidewall portions and sidewalls of the first and second patterns.

12. The method of claim 11, wherein a height of the second pattern from the face of the semiconductor substrate is less than a height of the another of the first patterns from the face of the semiconductor substrate.

13. The method of claim 11, wherein the first insulation layer is a multilayer film comprising a lowermost layer of silicon oxide and an uppermost layer of silicon nitride.

14. The method of claim 11, further comprising:
(h) for each of the first and second patterns, removing one of the second conductive film sidewall portions so as to leave a second conductive film sidewall portion over only one sidewall to serve as a memory gate electrode.

15. The method of claim 14, further comprising:
(i), after said step (h), forming source regions and drain regions in said memory cell region; and
(j), after said step (i), forming a silicide layer over upper faces of said memory gate electrodes, over upper faces of said source regions, and over upper faces of said drain regions in said memory cell region.

16. The method of claim 11, wherein the second gate insulation layer is a multilayer film comprising a charge accumulation layer of silicon nitride arranged between layers of silicon oxide.

* * * * *